(12) United States Patent
Barus

(10) Patent No.: US 8,812,287 B2
(45) Date of Patent: Aug. 19, 2014

(54) AUTONOMOUS, SCALABLE, DIGITAL SYSTEM FOR EMULATION OF WIRED-OR HARDWARE CONNECTION

(75) Inventor: Daniel J Barus, Hyde Park, NY (US)

(73) Assignee: International Business Machines Corporation, Armonk, NY (US)

( * ) Notice: Subject to any disclaimer, the term of this patent is extended or adjusted under 35 U.S.C. 154(b) by 863 days.

(21) Appl. No.: 13/022,647

(22) Filed: Feb. 8, 2011

(65) Prior Publication Data

US 2012/0203537 A1    Aug. 9, 2012

(51) Int. Cl.
*G06F 17/50* (2006.01)
*G06F 7/60* (2006.01)
*G06F 13/10* (2006.01)
*G06F 11/26* (2006.01)

(52) U.S. Cl.
CPC ............ *G06F 13/105* (2013.01); *G06F 11/261* (2013.01); *G06F 17/50* (2013.01)
USPC ................... 703/23; 703/13; 703/14; 703/15; 703/16; 703/17; 703/18; 703/19; 703/20; 703/21; 703/22; 703/24; 703/25; 703/26; 703/27; 703/28

(58) Field of Classification Search
None
See application file for complete search history.

(56) References Cited

U.S. PATENT DOCUMENTS

| 4,821,173 | A | | 4/1989 | Young et al. | |
|---|---|---|---|---|---|
| 5,371,741 | A | | 12/1994 | Entani | |
| 5,569,742 | A | | 10/1996 | Kirby et al. | |
| 5,615,136 | A | | 3/1997 | Baraton et al. | |
| 5,767,701 | A | * | 6/1998 | Choy et al. | 326/93 |
| 6,405,272 | B1 | * | 6/2002 | Regis | 710/121 |
| 6,522,169 | B2 | | 2/2003 | Anderson et al. | |
| 6,590,415 | B2 | * | 7/2003 | Agrawal et al. | 326/38 |
| 6,715,010 | B2 | * | 3/2004 | Kumata | 710/71 |
| 6,785,873 | B1 | * | 8/2004 | Tseng | 716/102 |
| 6,823,412 | B2 | * | 11/2004 | Regis | 710/121 |
| 6,876,229 | B1 | * | 4/2005 | Barus et al. | 326/82 |
| 6,954,451 | B1 | | 10/2005 | Jurasek et al. | |
| 7,353,308 | B2 | * | 4/2008 | Barus et al. | 710/110 |
| 7,512,728 | B2 | * | 3/2009 | Tseng | 710/100 |
| 7,605,604 | B1 | * | 10/2009 | Young | 326/38 |

(Continued)

FOREIGN PATENT DOCUMENTS

JP    63237161 A    10/1988
JP    02162433 A    6/1990

OTHER PUBLICATIONS van Leuken, Rene et al. "Integrated Circuit and System Design: Power and Timing Modeling, Optimization, and Scheduling", Sep. 2010.*
Rearick, et al. "Calibrating Clock Stretch During AC Scan Testing", 2002.*
Pontes et al. "SCAFFI: An intrachip FPGA asynchronous interface based on hard macros", 2007.*

(Continued)

*Primary Examiner* — Shambhavi Patel
(74) *Attorney, Agent, or Firm* — Margaret A McNamara; Dennis Jung

(57) ABSTRACT

A method and device for preserving the wired-OR nature of the clock signal connection between two devices without a direct analog connection between the lines and in an infinitely scalable fashion. The method includes detecting a logic state at a first connector and a second connector and driving an appropriate connector of the device to an active state in response to determining that a connector is driving an active state. The device includes first and second connectors for communicating logic states and driving active states in response to detected logic states.

12 Claims, 6 Drawing Sheets

(56) References Cited

U.S. PATENT DOCUMENTS

| | | | |
|---|---|---|---|
| 7,639,598 B2* | 12/2009 | Sovenyi | 370/203 |
| 7,759,974 B1* | 7/2010 | Young | 326/41 |
| 7,822,968 B2* | 10/2010 | Vorbach et al. | 713/100 |
| 7,825,695 B2* | 11/2010 | Whetsel | 326/86 |
| 8,046,505 B2* | 10/2011 | Worrell et al. | 710/35 |
| 8,243,714 B1* | 8/2012 | Hilton et al. | 370/350 |
| 2009/0011712 A1 | 1/2009 | Peng et al. | |
| 2010/0313089 A1* | 12/2010 | Rajski et al. | 714/731 |
| 2011/0010523 A1* | 1/2011 | Vorbach et al. | 712/18 |
| 2013/0061068 A1* | 3/2013 | Tremel et al. | 713/300 |

OTHER PUBLICATIONS

Ghosh et al. "Tolerance to Small Delay Defects by Adaptive Clock Stretching", 2007.*

Pontes et al. "Hermes-GLP: A GALS Network on Chip Router with Power Control Techniques", 2008.*

Lee et al. "Empirical Validation of Yield Recovery Using Idle-Cycle Insertion", 2007.*

"Method for Implementing Clock Stretching for a Half Duplex Open Collector Communications Protocol", published in IP.com Prior Art Database, vol. 6, No. 7A, IP.com No. IPCOM000137449D, Jun. 20, 2006.

* cited by examiner

U S 8,812,287 B2

AUTONOMOUS, SCALABLE, DIGITAL SYSTEM FOR EMULATION OF WIRED-OR HARDWARE CONNECTION

BACKGROUND OF THE INVENTION

1. Field of the Invention

The present invention generally relates to the field of integrated circuits and more particularly to the emulation of a wired-OR hardware connection.

2. Description of the Related Art

"Method and System For Providing Birectional Asynchronous Communication" (U.S. Pat. No. 6,876,229 B1, Apr. 5, 2005) discloses a communication system for establishing bidirectional, asynchronous communication between a first device and a second device. The system includes first asynchronous encoder logic and second asynchronous encoder logic for controlling the state of the communication system such that bi-directional communication is enabled without a direction control line.

Publication "Method For Implementing Clock Stretching For Half Duplex Open Collector Communications Protocol", IP.com, Vol. 6, No. 7A, (Jun. 20, 2006) outlines a method for facilitating clock stretching (clock synchronization). Clock stretching is a part of the data transmission protocol of SMBus, I2C bus and other bidirectional open collector/open drain buses. It allows a slave device to slow down the data transmission by "stretching" the clock signal which is being driven by the master. Clock stretching is trivial for a point to point connection of a master and slave device both of which use an open collector or open drain driver, In such a case, the slave can cause a pause in the data transmission, by driving the clock line low after the master has driven it low. When the master releases the clock line, the clock line stays low until the slave also releases it. The master will not transmit the next data byte until the slave releases the clock. This technique works with no additional hardware because of the unique characteristics of an open collector/open drain net.

When this type of communications bus is switched or routed through a programmable logic device, clock stretching is not easily implemented since most commercially available programmable logic devices do not allow direct connection between I/O thereby preventing the establishment of a true wired-OR connection. This invention addresses this situation and allows the implementation of clock stretching of bidirectional open collector/open drain signals routed through programmable logic devices.

SUMMARY OF THE INVENTION

According to an embodiment of the invention, a method for emulating an wired-OR hardware connection is provided. The method includes:
  detecting a logic state at a first connector and a second connector of a wired-OR logic control device;
  determining that a first node attached to the first connector is driving an active state;
  responsive to determining that a first node attached to the first connector of the logic device is driving an active state, driving, by the device, a second connector of the device to an active state;
  waiting for the first connector to stop driving the active state;
  determining that a first node attached to the first connector is not driving an active state;
  stop driving the second connector of the device to the active state in response to determining that the first connector is not driving an active state;
  determining that a second node attached to the second connector of the device is driving the second connector to an active state;
  driving, by the device, the first connector of the device to the active state in response to determining that a second node attached to the second connector of the device is driving the second connector to an active state;
  determining that a second node attached to the second connector of the device is not driving the second connector to an active state; and
  stop driving the first connector to an active state in response to determining that a second node attached to the second connector of the device is not driving the second connector to an active state.

According to another embodiment of the invention, a device for emulating a wired-OR hardware connection is provided. The device includes:
  a first connector for communicating a first logic state from a first node;
  a second connector for communicating a second logic state from a second node;
  at least one threshold detector coupled to receive an input from the first connector and an input from the second connector; wherein
  in response to the device determining that a first node is driving an active logic state at the first connector, the device is configured to perform a method, the method including:
  driving a second connector of the device to an active state;
  waiting for the first connector to stop driving the active state;
  determining that the first node attached to the first connector is not driving an active state;
  stop driving the second connector of the device to the active state in response to determining that the first connector is not driving an active state;
  determining that a second node attached to the second connector of the device is driving the second connector to an active state;
  driving, by the device, the first connector of the device to the active state in response to determining that a second node attached to the second connector of the device is driving the second connector to an active state;
  determining that a second node attached to the second connector of the device is not driving the second connector to an active state; and
  stop driving the first connector to an active state in response to determining that a second node attached to the second connector of the device is not driving the second connector to an active state.

This invention is a stand-alone solution. Also, this invention could theoretically be used for other applications involving the need to emulate a wired-OR hardware connection. For example, two comparators connected over a large distance. It could also be used in cases where signal re-drive is required.

In a communications system utilizing a synchronous clock which is directly connected between two devices in a wired-OR fashion, this invention provides a means to successfully maintain the properties of the direct wired-OR transmission on the synchronous clock line without the need for that direct connection between the two devices. This invention provides a means to automatically detect and account for an otherwise undetectable change in control between the two devices without requiring that the devices are directly connected through a hardwired connection.

DETAILED DESCRIPTION OF THE PREFERRED EMBODIMENT

Figure 1:
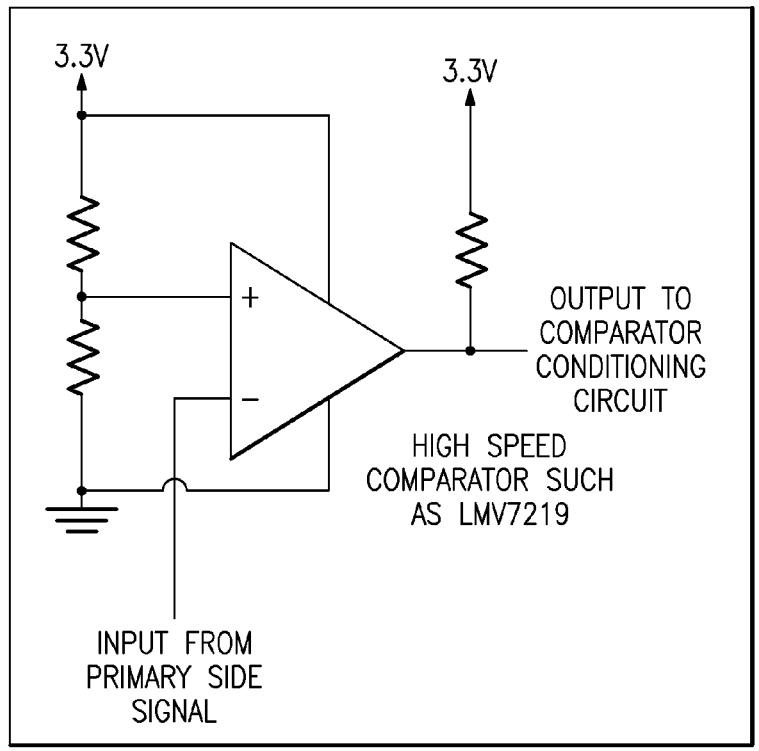
FIG. 1 shows the comparator circuit which senses the primary side signal.

Two-wire open-drain communications is used extensively in embedded systems and is often multiplexed, used in mixed-voltage environments, and extended/repeated to facilitate a large number of channels. Most if not all of these approaches require some form of direct analog connection between the clock signals of the communicating devices whether it be in the form of a transmission gate (pass-FET) or analog switch. This is necessary in order to preserve the wired-OR nature of the clock signal whereas it is not possible to know which of the communicating devices is mastering the bus and holding it in a logic-low state. This invention provides a digital means of preserving the wired-OR nature of the clock signal connection between two devices without a direct analog connection between the lines and in an infinitely scalable fashion. This invention advertises a digital solution which can be scaled to a customizable size making it extremely flexible. Also, significant cost savings, PCB real-estate savings, and system functionality enhancements are realizable with this invention. It can theoretically be applied in other applications, but is best suited for two-wire communications systems.

Multiplexers, switches, bus-extenders/repeaters, bus-isolation ICs, and discrete pass-FETs are all current solutions used in transmitting and multiplexing the clock signal in two-wire open-drain communications systems. Virtually all of these current solutions are only offered in discretely sized and packaged ICs (i.e. 8-channel, 16-channel, SOIC, TSSOP, etc.). In systems with a requirement for many channels, a great deal of cost and PCB component area is consumed. Also, usually only one type of control interface is offered on these devices to perform tasks such as changing the multiplexing channel. This invention allows any control interface to be integrated into it when implemented as a multiplexer. Also, not all of these are autonomous and some do require direction control to successfully establish communications flow. As mentioned previously, most if not all of these solutions are analog in nature, whereas this invention suggests a digital method of accomplishing the properties of the analog wired-OR connection thus making it scalable to accommodate any number of channels.

The embodiment of the invention includes the following modules (quantity shown in parentheses):
One Comparator circuit—connected to the primary side signal; senses relationship of primary side signal to preset detection threshold One Comparator output conditioning circuit—processes the comparator output to provide an acceptable input for the central state machine (glitch-free operation)
Two Input synchronization flip-flops—synchronizes each side's input signal to the system clock
One Central state machine—uses inputs from both the primary and secondary sides, the counters, and the comparator conditioning circuit to adjust the output drivers for each side accordingly
Two Counters—used to implement delays which allows the state machine to compensate for rise and fall times inherent to both the primary and secondary signals
Two Input/Output buffers—one high-impedance input buffer and one open-drain driver for each of the two devices; an OR-gate is included in the primary side logic to facilitate a quicker response in pulling the primary side signal low.

With the exception of the comparator circuit, each module is most readily created inside of a CPLD or FPGA. This is the most preferred embodiment of the invention since it results in the most advantages with regard to timing, cost, size, etc. The comparator circuit is a single low-cost, high-speed comparator with only a few external components which as a whole resides externally to the CPLD/FPGA.

The default states for both the primary and secondary signals are a logic-high. When a logic-low is sensed on the primary side, the opposing secondary side is driven low by the state machine. A small delay is endured to ensure that each signal reaches a logic-low state before the state machine proceeds. After delay expiration, the comparator circuit on the primary side is then monitored. If a breach in the detection threshold is sensed, then the state machine becomes aware that the primary side has risen only slightly and wishes to release to a full logic-high. With this piece of information known, the state machine quickly switches drivers forcing the primary side back low and releasing the secondary side driver. The response speed is critical in pulling the primary side signal low since it must not breach the logic threshold. This speed is accomplished through the use of an OR-gate in the primary side buffer drive logic. Assertion of the detect signal will immediately activate the primary driver allowing the signal to be pulled low even before the state machine logic can clock out the appropriate state outputs to drive it low. With no change in the logic level on either side yet, the state machine waits for a logic-high on the secondary side. Once detected, the primary side is released to a logic-high. Another delay is present to account for pull-up rise time as the primary signal transitions to a logic-high after which both signals are at their default (idle) states.

The process is only slightly different when the secondary device initiates. When a logic-low is sensed on the secondary side, the state machine drivers for both the primary and secondary sides are driven low for a preset amount of time. This is done to guarantee a specific low time on both sides and to allow for the fall-times of each signal. Once the delay has expired, the state machine releases its primary side driver. At this time, the comparator circuit on the primary side is monitored. If a breach in the detection threshold is sensed, then the state machine becomes aware that the primary side has risen only slightly and wishes to release to a full logic-high. With this piece of information known, the state machine quickly switches drivers forcing the primary side back down and releasing the secondary side driver. The state machine waits for a logic-high on the secondary side. Once detected, the state machine understands that both the primary and secondary devices wish to release their signals and return the bus to the idle state (both signals logic-high). To achieve this, the primary side is released to a logic-high. Again, the delay is present to account for pull-up rise time as the primary signal transitions to a logic-high after which both the primary and secondary are at their default (idle) states.

The state machine uses its drivers on the primary and secondary sides to strategically determine which device or devices are actively driving the bus. It does this by releasing the primary side at a strategic time and learning before it breaches a logic level threshold whether or not it is driving the bus low. It is designed to respond quickly such that the communications stream is not adversely affected.

In a wired-OR arrangement, it is not intuitively apparent how an observer would be able to determine which device is actually holding the bus low. It could be the primary device or the secondary device or both. The device or devices that are driving the bus must be known in order to implement any sort of autonomous system that can transmit the information digitally such as this invention does.

Any system that uses two-wire open-drain communications such as I2C or SMBus and requires a large number of channels may benefit from this invention. When implemented as a multiplexer, any control interface such as an address-data bus or serial communications interface (SCI) may be added to it to facilitate channel changing, etc. Also, custom error-detection logic can be added to aid in communications errors discovery. When implemented in a PLD or FPGA, the channels' locations may be reconfigured/remapped extremely easily thereby offering the designer an extraordinary amount of flexibility. It also offers other benefits such as hot-plug support and lower cost per I/O. The main advantage of this invention is its scalability. Any number of channels can be added to create a scalable multiplexer which has a greater cost and component area advantage over discrete solutions.

FIG. 1 shows the comparator circuit which senses the primary side signal. The non-inverting terminal of the comparator is connected to a threshold reference voltage generated by a simple resistor divider. Another means of setting the reference voltage may be used if low cost and small component area are not a concern. The inverting terminal is connected to the primary side signal directly. Since it is a high impedance input, the primary side signal is not corrupted. A pull-up resistor is at the output of the comparator.

The function of the circuit is to produce a low output whenever the primary side signal's voltage is above the threshold voltage. The threshold voltage set by the divider should be around 0.4V to 0.7V so as to avoid breaching of a V(IL) threshold.

Figure 2:
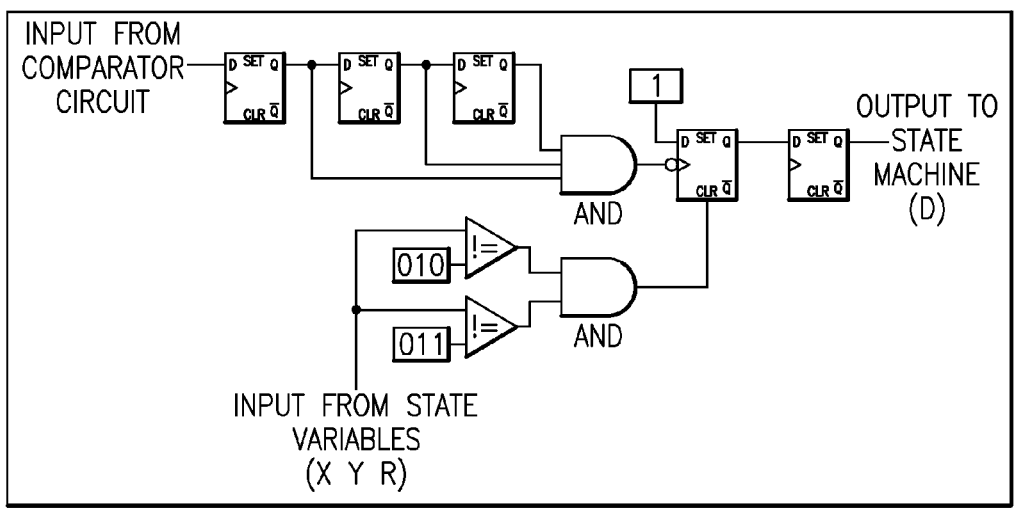
FIG. 2 shows the comparator conditioning circuit.

The comparator conditioning circuit in FIG. 2 is designed to output a '1' only when the falling edge of the comparator is encountered (and the state machine is in the appropriate state). The falling edge of the comparator signifies a low-to-high transition on the primary signal which is the event indicating the primary device wishes to release its driver. When the comparator drives low, the falling-edge-triggered flip-flop clocks a '1' to its output provided that the present state of the state machine is not 010 or 011 at that time (which it should not be). The output is then buffered by another flip-flop to synchronize it with the rising-edge. The output is reset to a '0' when the state machine leaves states 010 and 011.

Figure 3:
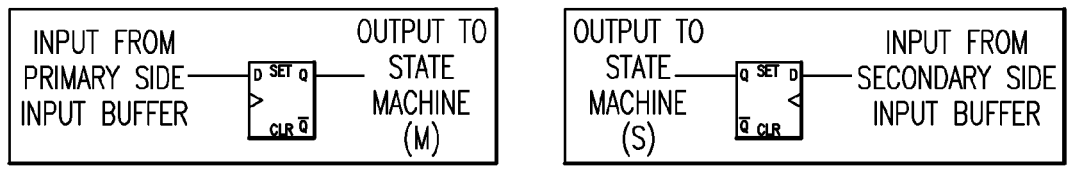
FIG. 3 shows the rising-edge-triggered flip-flops.
Figure 4:
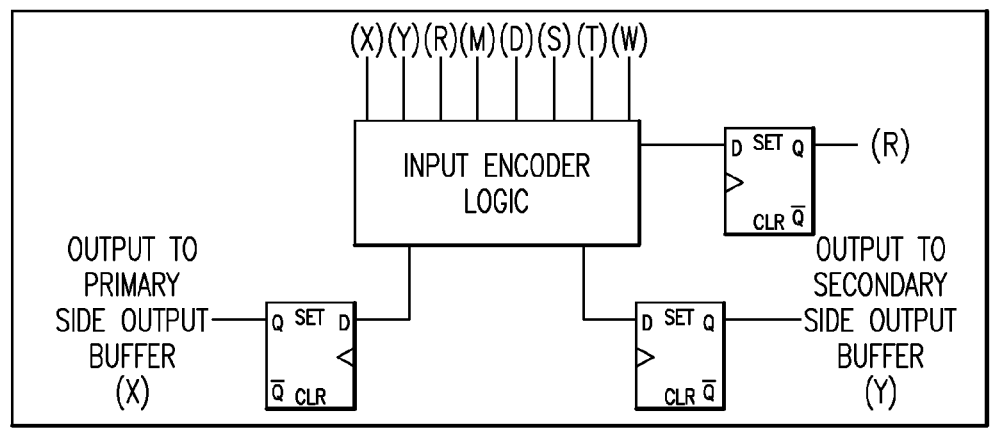
FIG. 4 shows the central state machine.

The rising-edge-triggered flip-flops in FIG. 3 are present simply to provide synchronous inputs to the state machine from both the primary and secondary signals.

The central state machine controls the output drivers on both the primary and secondary sides, enables and clears the counters, and enables and clears the comparator conditioning circuit. The following is a brief explanation of the state machine's variables/inputs:

Present State Outputs:
X=master or primary side driver enable; when '1', the open-drain driver connected to the primary side is turned on; when '0', Hi-Z.
Y=slave or secondary side driver enable; when '1', the open-drain driver connected to the secondary side is turned on; when '0', Hi-Z.
R=reverse direction; indicator which denotes the side from which activity was first detected; when '1', this indicates the secondary side was the first to initiate; when '0', the primary side was first.

Figure 5:
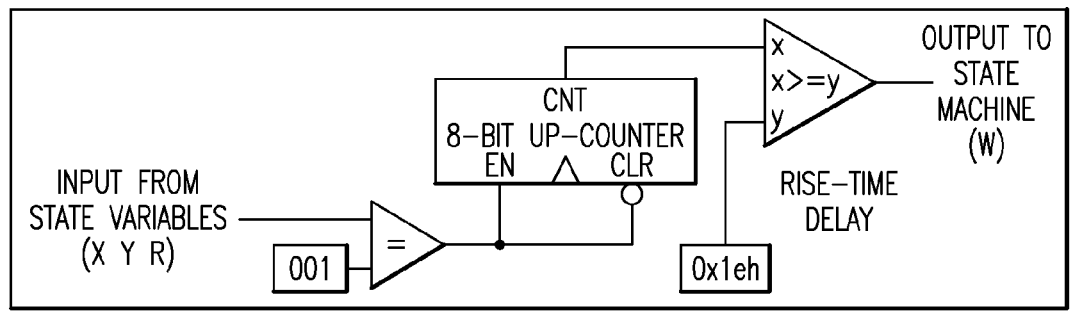
FIG. 5 shows the rise-time counter.
Figure 6:
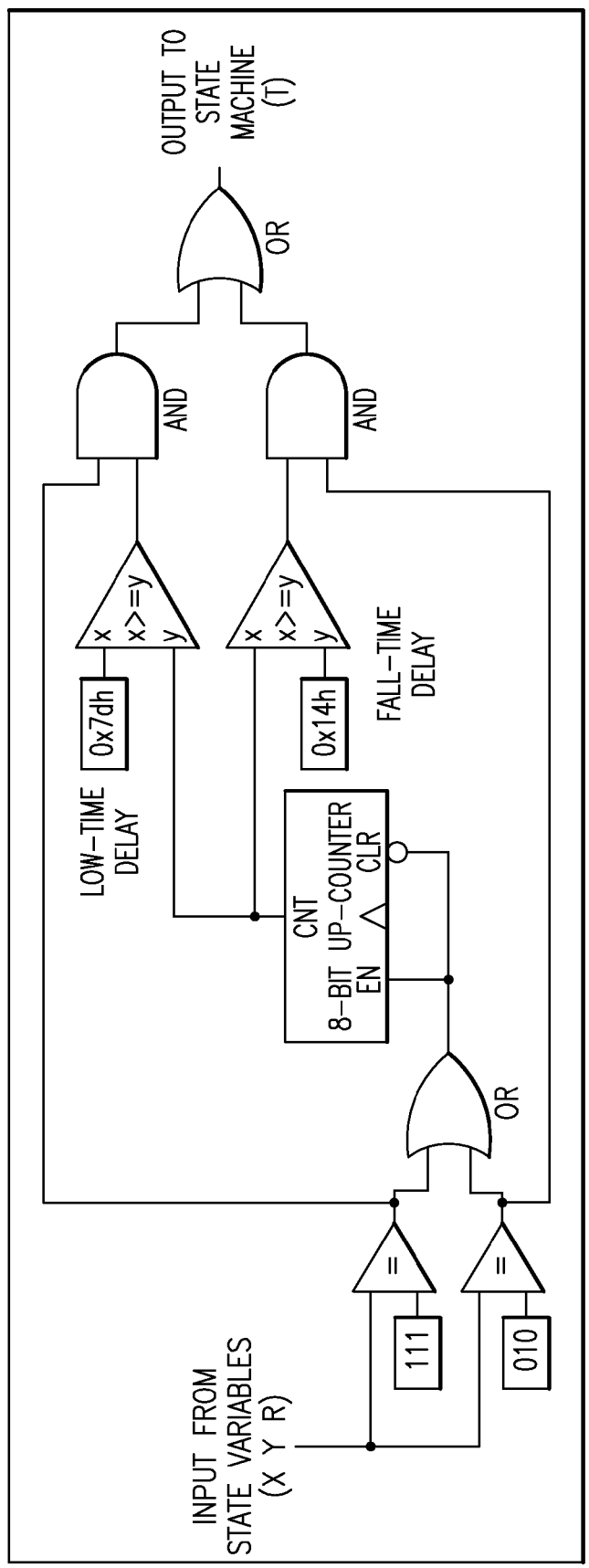
FIG. 6 depicts a second counter.

Inputs:
M=master or primary side signal input
D=detection input from the comparator output conditioning circuit
S=slave or secondary side signal input
T=timer trigger which indicates when the low-time delay counter has expired
W=wait-timer trigger which indicates when the rise-time delay counter has expired The rise-time counter in FIG. 5 is an 8-bit rising-edge up-counter with enable and clear. It is used for delay state 001. When the state machine enters state 001, the counter is enabled and begins counting on each clock rising-edge. When it reaches a value greater than or equal to the specified limit value, the output is asserted to a '1'. The state machine will change state based on this output and when the state is no longer 001 the counter will reset.

The second counter is also an 8-bit rising-edge up-counter with enable and clear, and it operates similarly. It is used for both the low-time delay in state 111 and the fall-time delay in state 010. When either 111 or 010 is the present state of the state machine, the counter is enabled and counts up on each clock rising-edge. The output is asserted when the count equals or surpasses the limit value of the corresponding present state. The counter is cleared once the state machine advances to another state.

Figure 7:
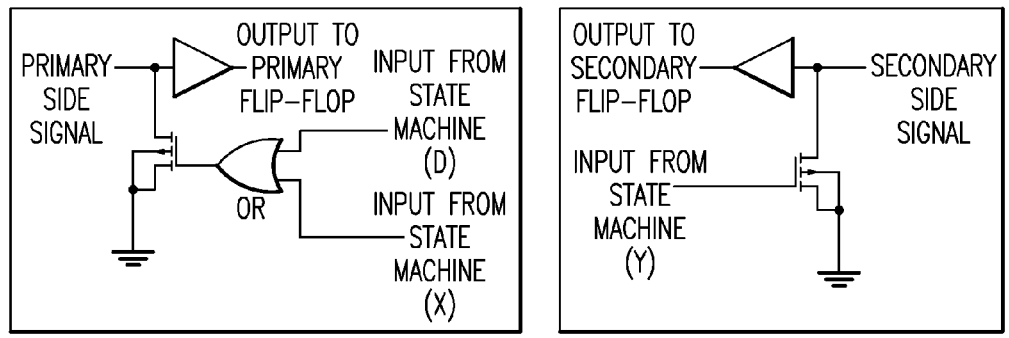
FIG. 7 shows the I/O buffers.
Figure 9:
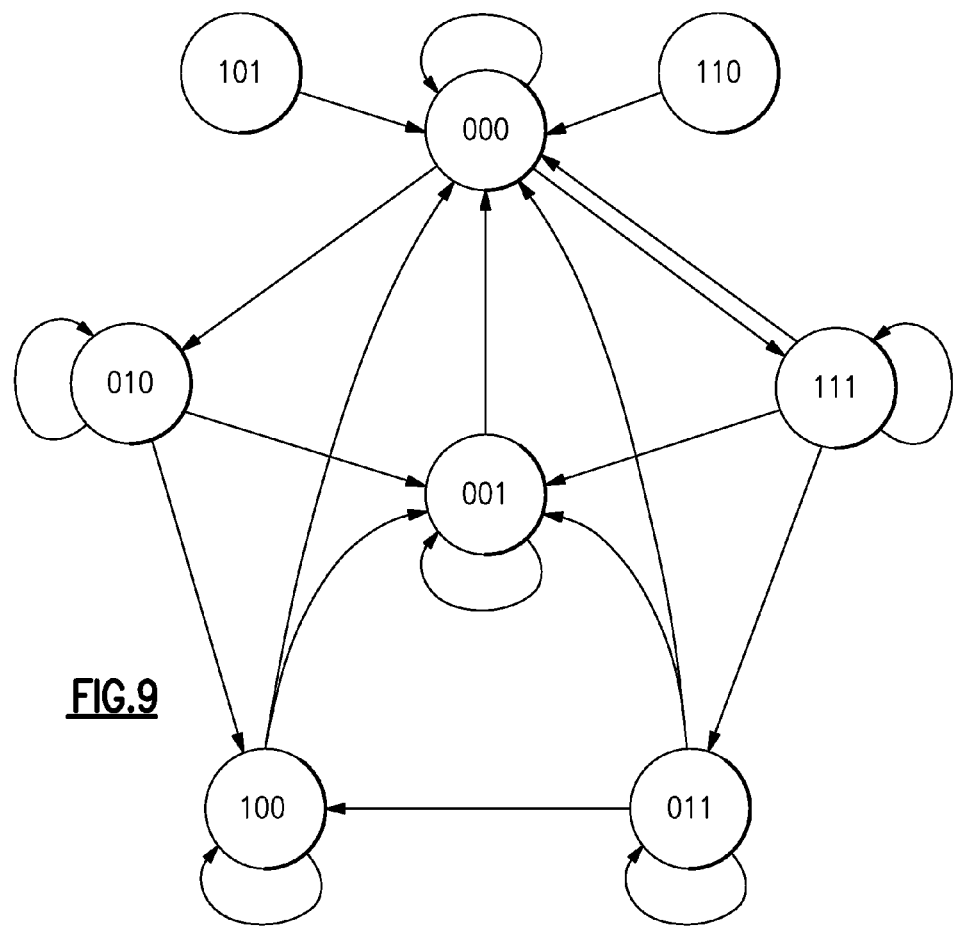
FIG. 9 depicts the state diagrams.

Each I/O buffer in FIG. 7 contains an open-drain driver and a corresponding high-impedance input buffer. The primary side includes a simple OR-gate to allow either the state machine or the comparator conditioning circuit to drive its output. This is done to shorten the response time between when a low-to-high transition is taking place on the primary signal and the primary side driver is activated to pull it fully low again. If too long a time is taken to activate the driver, the primary signal could potentially breach the V(IL) threshold and hose communications.

Figure 8:
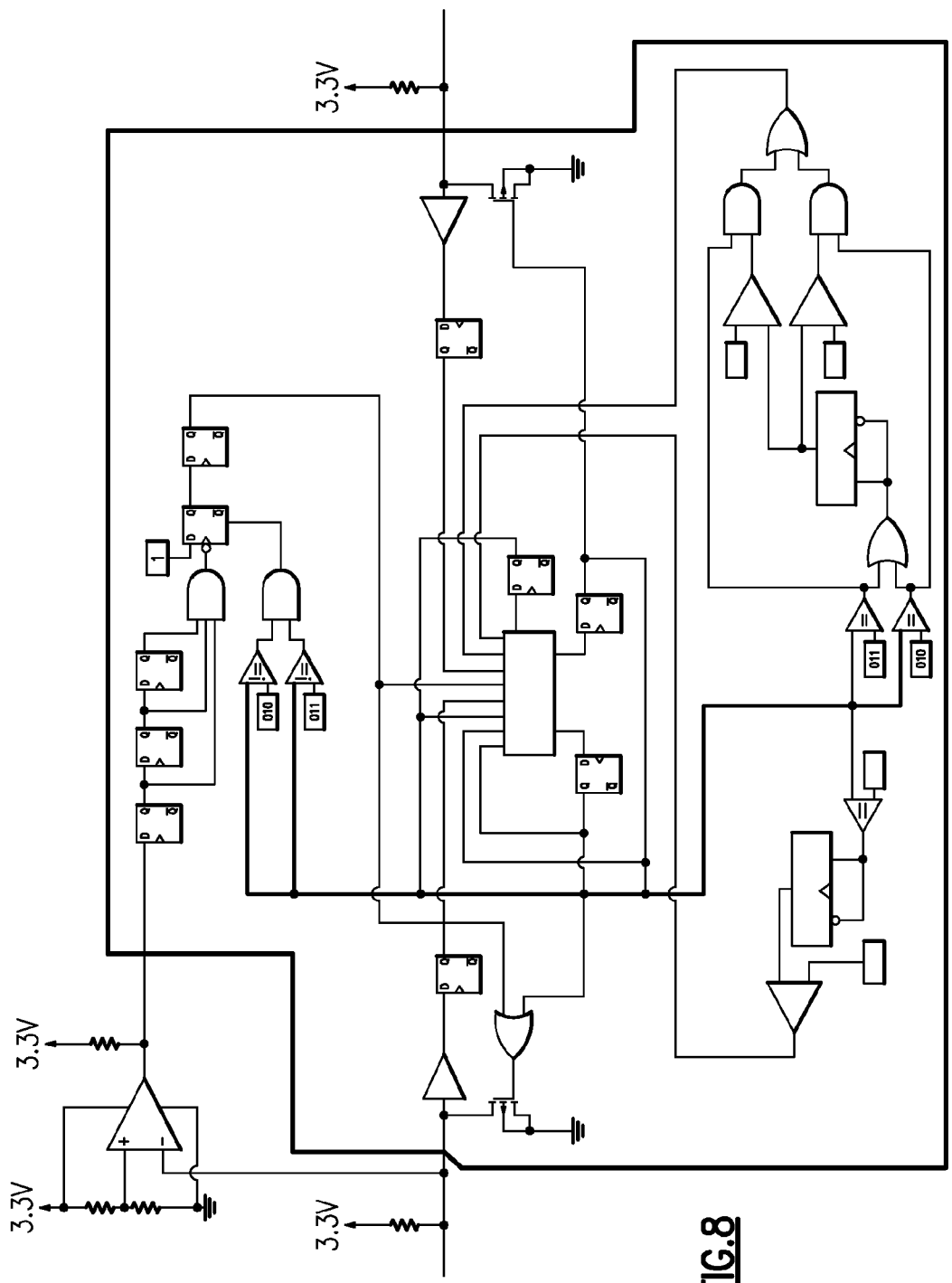
FIG. 8 shows an overview of. the full system

FIG. 8 illustrates a full system with all components connected together. The red outline denotes the portion of the design that is typically implemented inside of a PLD or FPGA. The comparator circuit and external bus pull-up resistors are typically discrete components external to the PLD or FPGA.

The system clock frequency is approximately 100 MHz. This may be increased but timing considerations must be made. The limit values for each counter must be scaled appropriately.

Figure 10:
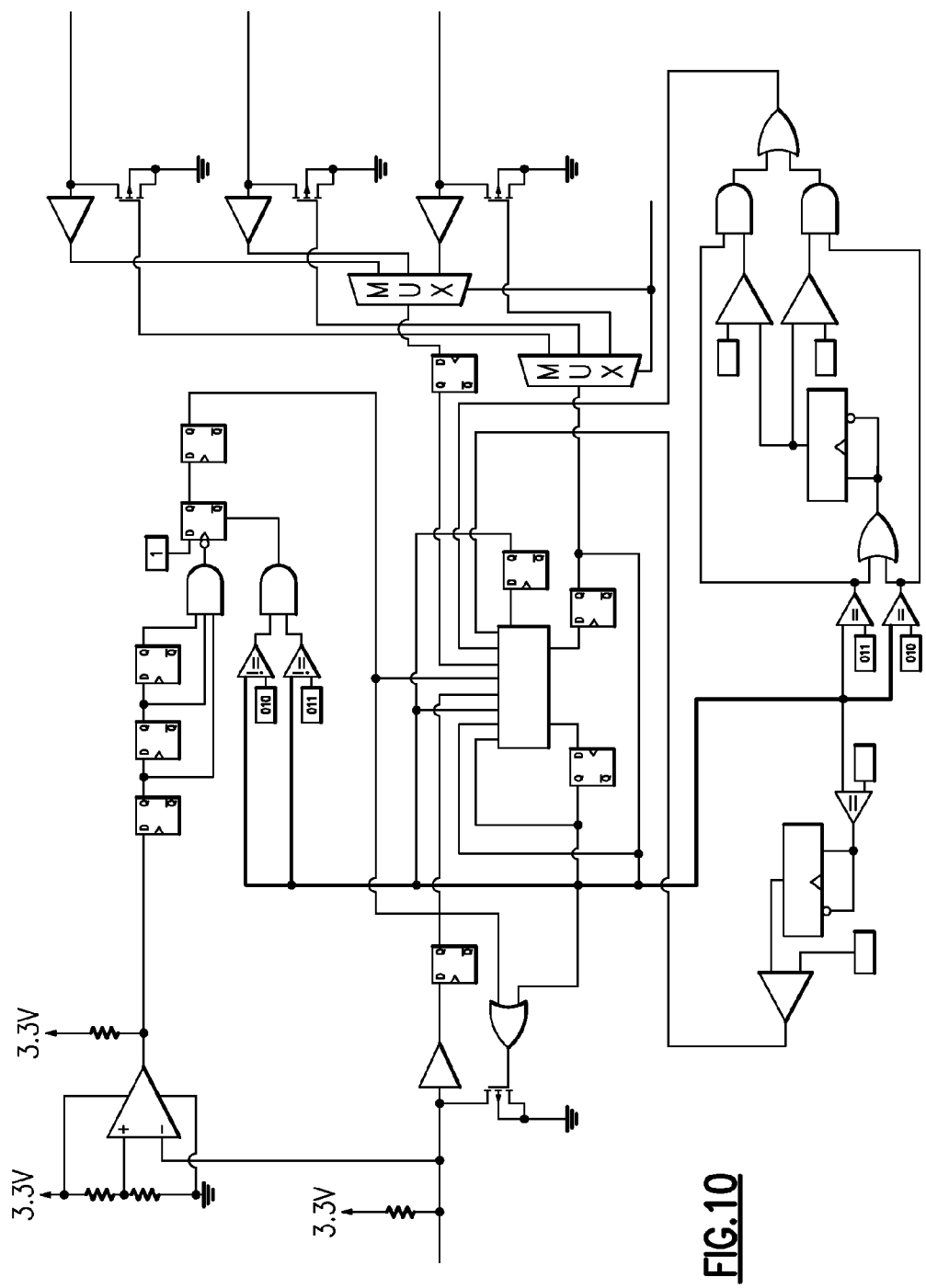
FIG. 10 depicts a system with multiplexed secondary channels.

FIG. 10 illustrates how to generate a system with multiplexed secondary channels. This allows a single primary channel to be connected to any one of many secondary channels. Only one may be connected at a time. To accomplish this, the multiplexers shown in FIG. 10 in blue and gold colors are required to be added. The secondary channel to be connected is selected via the channel select. Any number of secondary channels may be added making the invention extremely scalable.

The state diagram for the state machine is shown in Table 1. The colors shown for each state correlate with the colors shown in the state transition table. Present State variables X, Y, and R are shown inside of each state. The inputs for each state transition are not shown since this would be too cumbersome. They can be read from the state transition table. The abbreviations "M" and "S" denote "master" and "slave", respectively, referring to either the primary or secondary sides of the state machine. Errors are explained and error codes are assigned to identify invalid input combinations.

TABLE 1

State Transition Table

| PRESENT STATE | | | INPUTS | | | | | NEXT STATE | | | EVENT EXPLANATION |
|---|---|---|---|---|---|---|---|---|---|---|---|
| X | Y | R | M | D | S | T | W | X' | Y' | R' | |
| 0 | 0 | 0 idle | 0 | 0 | 0 | 0 | 0 | 0 | 0 | 0 | M and S go low at exact same time, detect functioning properly |
| | | | 0 | 0 | 0 | 0 | 1 | 0 | 0 | 0 | M and S go low at exact same time, detect functioning properly |
| | | | 0 | 0 | 0 | 1 | 1 | 0 | 0 | 0 | M and S go low at exact same time, detect functioning properly |
| | | | 0 | 0 | 0 | 1 | 0 | 0 | 0 | 0 | M and S go low at exact same time, detect functioning properly |
| | | | 0 | 0 | 1 | 1 | 0 | 0 | 1 | 0 | M goes low, detect signal is triggered, 4.5us counter not idle |
| | | | 0 | 0 | 1 | 1 | 1 | 0 | 1 | 0 | M goes low, detect signal is triggered, both delay counters not idle |
| | | | 0 | 0 | 1 | 0 | 1 | 0 | 1 | 0 | M goes low, detect signal is triggered, rise time delay counter not idle |
| | | | 0 | 0 | 1 | 0 | 0 | 0 | 1 | 0 | M goes low, detect signal is triggered, both delay counters idle |
| | | | 0 | 1 | 1 | 0 | 0 | 0 | 1 | 0 | M goes low, detect signal not functioning correctly |
| | | | 0 | 1 | 1 | 0 | 1 | 0 | 1 | 0 | M goes low, detect signal not functioning correctly |
| | | | 0 | 1 | 1 | 1 | 1 | 0 | 1 | 0 | M goes low, detect signal not functioning correctly |
| | | | 0 | 1 | 1 | 1 | 0 | 0 | 1 | 0 | M goes low, detect signal not functioning correctly |
| | | | 0 | 1 | 0 | 1 | 0 | 0 | 0 | 0 | M and S go low at exact same time, detect not functioning properly |
| | | | 0 | 1 | 0 | 1 | 1 | 0 | 0 | 0 | M and S go low at exact same time, detect not functioning properly |
| | | | 0 | 1 | 0 | 0 | 1 | 0 | 0 | 0 | M and S go low at exact same time, detect not functioning properly |
| | | | 0 | 1 | 0 | 0 | 0 | 0 | 0 | 0 | M and S go low at exact same time, detect not functioning properly |
| | | | 1 | 1 | 0 | 0 | 0 | 1 | 1 | 1 | S goes low, both counters idle |
| | | | 1 | 1 | 0 | 0 | 1 | 1 | 1 | 1 | S goes low, rise time delay counter not idle |
| | | | 1 | 1 | 0 | 1 | 1 | 1 | 1 | 1 | S goes low, both delay counters not idle |
| | | | 1 | 1 | 0 | 1 | 0 | 1 | 1 | 1 | S goes low, 4.5us delay counter not idle |
| | | | 1 | 1 | 1 | 1 | 0 | 0 | 0 | 0 | Bus idle |
| | | | 1 | 1 | 1 | 1 | 1 | 0 | 0 | 0 | Bus idle |
| | | | 1 | 1 | 1 | 0 | 1 | 0 | 0 | 0 | Bus idle |
| | | | 1 | 1 | 1 | 0 | 0 | 0 | 0 | 0 | Bus idle |
| | | | 1 | 0 | 1 | 0 | 0 | 0 | 0 | 0 | Detect signal goes low without M going low |
| | | | 1 | 0 | 1 | 0 | 1 | 0 | 0 | 0 | Detect signal goes low without M going low |
| | | | 1 | 0 | 1 | 1 | 1 | 0 | 0 | 0 | Detect signal goes low without M going low |
| | | | 1 | 0 | 1 | 1 | 0 | 0 | 0 | 0 | Detect signal goes low without M going low |
| | | | 1 | 0 | 0 | 1 | 0 | 1 | 1 | 1 | S goes low |
| | | | 1 | 0 | 0 | 1 | 1 | 1 | 1 | 1 | S goes low |
| | | | 1 | 0 | 0 | 0 | 1 | 1 | 1 | 1 | S goes low |
| | | | 1 | 0 | 0 | 0 | 0 | 1 | 1 | 1 | S goes low |
| 0 | 0 | 1 wait state | 0 | 0 | 0 | 0 | 0 | 0 | 0 | 1 | Rise time delay counter not yet expired |
| | | | 0 | 0 | 0 | 0 | 1 | 0 | 0 | 0 | Rise time delay expired, both M and S still low |
| | | | 0 | 0 | 0 | 1 | 1 | 0 | 0 | 0 | Rise time delay expired, both M and S still low |

TABLE 1-continued

State Transition Table

| | | | | | | | | | | | | |
|---|---|---|---|---|---|---|---|---|---|---|---|---|
| | | | | 0 | 0 | 0 | 1 | 0 | 0 | 0 | 1 | Rise time delay counter not yet expired |
| | | | | 0 | 0 | 1 | 1 | 0 | 0 | 0 | 1 | Rise time delay counter not yet expired |
| | | | | 0 | 0 | 1 | 1 | 1 | 0 | 0 | 0 | M still low after bus release and delay expired |
| | | | | 0 | 0 | 1 | 0 | 1 | 0 | 0 | 0 | M still low after bus release and delay expired |
| | | | | 0 | 0 | 1 | 0 | 0 | 0 | 0 | 1 | Rise time delay counter not yet expired |
| | | | | 0 | 1 | 1 | 0 | 0 | 0 | 0 | 1 | Rise time delay counter not yet expired |
| | | | | 0 | 1 | 1 | 0 | 1 | 0 | 0 | 0 | M still low after bus release and delay expired, detect not functioning |
| | | | | 0 | 1 | 1 | 1 | 1 | 0 | 0 | 0 | M still low after bus release and delay expired, detect not functioning |
| | | | | 0 | 1 | 1 | 1 | 0 | 0 | 0 | 1 | Rise time delay counter not yet expired |
| | | | | 0 | 1 | 0 | 1 | 0 | 0 | 0 | 1 | Rise time delay counter not yet expired |
| | | | | 0 | 1 | 0 | 1 | 1 | 0 | 0 | 0 | Rise time delay expired, both M and S still low, detect not functioning |
| | | | | 0 | 1 | 0 | 0 | 1 | 0 | 0 | 0 | Rise time delay expired, both M and S still low, detect not functioning |
| | | | | 0 | 1 | 0 | 0 | 0 | 0 | 0 | 1 | Rise time delay counter not yet expired |
| | | | | 1 | 1 | 0 | 0 | 0 | 0 | 0 | 1 | Rise time delay counter not yet expired |
| | | | | 1 | 1 | 0 | 0 | 1 | 0 | 0 | 0 | S still low after bus release and delay expired |
| | | | | 1 | 1 | 0 | 1 | 1 | 0 | 0 | 0 | S still low after bus release and delay expired |
| | | | | 1 | 1 | 0 | 1 | 0 | 0 | 0 | 1 | Rise time delay counter not yet expired |
| | | | | 1 | 1 | 1 | 1 | 0 | 0 | 0 | 1 | Rise time delay counter not yet expired |
| | | | | 1 | 1 | 1 | 1 | 1 | 0 | 0 | 0 | Bus idle when delay expires |
| | | | | 1 | 1 | 1 | 0 | 1 | 0 | 0 | 0 | Bus idle when delay expires |
| | | | | 1 | 1 | 1 | 0 | 0 | 0 | 0 | 1 | Rise time delay counter not yet expired |
| | | | | 1 | 0 | 1 | 0 | 0 | 0 | 0 | 1 | Rise time delay counter not yet expired |
| | | | | 1 | 0 | 1 | 0 | 1 | 0 | 0 | 0 | Bus idle when delay expires, detect signel not functioning correctly |
| | | | | 1 | 0 | 1 | 1 | 1 | 0 | 0 | 0 | Bus idle when delay expires, detect signel not functioning correctly |
| | | | | 1 | 0 | 1 | 1 | 0 | 0 | 0 | 1 | Rise time delay counter not yet expired |
| | | | | 1 | 0 | 0 | 1 | 0 | 0 | 0 | 1 | Rise time delay counter not yet expired |
| | | | | 1 | 0 | 0 | 1 | 1 | 0 | 0 | 0 | S still low after bus release and delay expired, detect not functioning |
| | | | | 1 | 0 | 0 | 0 | 1 | 0 | 0 | 0 | S still low after bus release and delay expired, detect not functioning |
| | | | | 1 | 0 | 0 | 0 | 0 | 0 | 0 | 1 | Rise time delay counter not yet expired |
| 0 | 1 | 0 | M initiated, Hold S, Wait M detect | 0 | 0 | 0 | 0 | 0 | 0 | 1 | 0 | All low, state delay NOT expired yet, keep waiting for S decay |
| | | | | 0 | 0 | 0 | 0 | 1 | 0 | 1 | 0 | All low, state delay NOT expired yet, keep waiting for S decay |
| | | | | 0 | 0 | 0 | 1 | 1 | 0 | 1 | 0 | Both low, state delay (T) expired |
| | | | | 0 | 0 | 0 | 1 | 0 | 0 | 1 | 0 | Both low, state delay (T) expired |
| | | | | 0 | 0 | 1 | 1 | 0 | 0 | 0 | 1 | S not low yet or stuck high after state delay expired |
| | | | | 0 | 0 | 1 | 1 | 1 | 0 | 0 | 1 | S not low yet or stuck high after state delay expired |
| | | | | 0 | 0 | 1 | 0 | 1 | 0 | 1 | 0 | S not low yet or stuck high (keep waiting for state delay to |

TABLE 1-continued

State Transition Table

| | | | | | | | | | | | | |
|---|---|---|---|---|---|---|---|---|---|---|---|---|
| | | | | | | | | | | | | expire) |
| | | | | 0 | 0 | 1 | 0 | 0 | 0 | 1 | 0 | S not low yet or stuck high (keep waiting for state delay to expire) |
| | | | | 0 | 1 | 1 | 0 | 0 | 0 | 1 | 0 | State delay (T) NOT expired yet |
| | | | | 0 | 1 | 1 | 0 | 1 | 0 | 1 | 0 | State delay (T) NOT expired yet |
| | | | | 0 | 1 | 1 | 1 | 1 | 0 | 0 | 1 | Detect signal not functioning, S not low yet or stuck high |
| | | | | 0 | 1 | 1 | 1 | 0 | 0 | 0 | 1 | Detect signal not functioning, S not low yet or stuck high |
| | | | | 0 | 1 | 0 | 1 | 0 | 1 | 0 | 0 | M detected going high (but not fully high yet) |
| | | | | 0 | 1 | 0 | 1 | 1 | 1 | 0 | 0 | M detected going high (but not fully high yet) |
| | | | | 0 | 1 | 0 | 0 | 1 | 0 | 1 | 0 | State delay (T) NOT expired yet |
| | | | | 0 | 1 | 0 | 0 | 0 | 0 | 1 | 0 | State delay (T) NOT expired yet |
| | | | | 1 | 1 | 0 | 0 | 0 | 0 | 1 | 0 | State delay (T) NOT expired yet |
| | | | | 1 | 1 | 0 | 0 | 1 | 0 | 1 | 0 | State delay (T) NOT expired yet |
| | | | | 1 | 1 | 0 | 1 | 1 | 0 | 0 | 1 | M detected going high, M already reached full high level |
| | | | | 1 | 1 | 0 | 1 | 0 | 0 | 0 | 1 | M detected going high, M already reached full high level |
| | | | | 1 | 1 | 1 | 1 | 0 | 0 | 0 | 1 | M detected going high, M already reached full high level |
| | | | | 1 | 1 | 1 | 1 | 1 | 0 | 0 | 1 | M detected going high, M already reached full high level |
| | | | | 1 | 1 | 1 | 0 | 1 | 0 | 1 | 0 | State delay (T) NOT expired yet |
| | | | | 1 | 1 | 1 | 0 | 0 | 0 | 1 | 0 | State delay (T) NOT expired yet |
| | | | | 1 | 0 | 1 | 0 | 0 | 0 | 1 | 0 | State delay (T) NOT expired yet |
| | | | | 1 | 0 | 1 | 0 | 1 | 0 | 1 | 0 | State delay (T) NOT expired yet |
| | | | | 1 | 0 | 1 | 1 | 1 | 0 | 0 | 1 | M already reached full high level, detect signal not functioning |
| | | | | 1 | 0 | 1 | 1 | 0 | 0 | 0 | 1 | M already reached full high level, detect signal not functioning |
| | | | | 1 | 0 | 0 | 1 | 0 | 0 | 0 | 1 | M already reached full high level, detect signal not functioning |
| | | | | 1 | 0 | 0 | 1 | 1 | 0 | 0 | 1 | M already reached full high level, detect signal not functioning |
| | | | | 1 | 0 | 0 | 0 | 1 | 0 | 1 | 0 | State delay (T) NOT expired yet |
| | | | | 1 | 0 | 0 | 0 | 0 | 0 | 1 | 0 | State delay (T) NOT expired yet |
| 0 | 1 | 1 | 4.5us expired, Hold S, Wait M detect | 0 | 0 | 0 | 0 | 0 | 0 | 1 | 1 | Waiting for M detect |
| | | | | 0 | 0 | 0 | 0 | 1 | 0 | 1 | 1 | Waiting for M detect |
| | | | | 0 | 0 | 0 | 1 | 1 | 0 | 1 | 1 | Waiting for M detect |
| | | | | 0 | 0 | 0 | 1 | 0 | 0 | 1 | 1 | Waiting for M detect |
| | | | | 0 | 0 | 1 | 1 | 0 | 0 | 0 | 1 | S goes high while being forced low |
| | | | | 0 | 0 | 1 | 1 | 1 | 0 | 0 | 1 | S goes high while being forced low |
| | | | | 0 | 0 | 1 | 0 | 1 | 0 | 0 | 1 | S goes high while being forced low |
| | | | | 0 | 0 | 1 | 0 | 0 | 0 | 0 | 1 | S goes high while being forced low |
| | | | | 0 | 1 | 1 | 0 | 0 | 0 | 0 | 1 | S goes high while being forced low |
| | | | | 0 | 1 | 1 | 0 | 1 | 0 | 0 | 1 | S goes high while being forced low |
| | | | | 0 | 1 | 1 | 1 | 1 | 0 | 0 | 1 | S goes high while being forced low |
| | | | | 0 | 1 | 1 | 1 | 0 | 0 | 0 | 1 | S goes high while being forced low |
| | | | | 0 | 1 | 0 | 1 | 0 | 1 | 0 | 0 | M detected going high (but not fully high yet) |
| | | | | 0 | 1 | 0 | 1 | 1 | 1 | 0 | 0 | M detected going high (but not fully high yet) |
| | | | | 0 | 1 | 0 | 0 | 1 | 1 | 0 | 0 | M detected going high (but not fully high yet) |
| | | | | 0 | 1 | 0 | 0 | 0 | 1 | 0 | 0 | M detected going high (but not fully high yet) |
| | | | | 1 | 1 | 0 | 0 | 0 | 0 | 0 | 1 | M detected going high, M already reached full high level |
| | | | | 1 | 1 | 0 | 0 | 1 | 0 | 0 | 1 | M detected going high, M already reached full high level |

TABLE 1-continued

State Transition Table

| | | | | | | | | | | | | |
|---|---|---|---|---|---|---|---|---|---|---|---|---|
| | | | | 1 | 1 | 0 | 1 | 1 | 0 | 0 | 1 | M detected going high, M already reached full high level |
| | | | | 1 | 1 | 0 | 1 | 0 | 0 | 0 | 1 | M detected going high, M already reached full high level |
| | | | | 1 | 1 | 1 | 1 | 0 | 0 | 0 | 0 | M and S high while both forced low |
| | | | | 1 | 1 | 1 | 1 | 1 | 0 | 0 | 0 | M and S high while both forced low |
| | | | | 1 | 1 | 1 | 0 | 1 | 0 | 0 | 0 | M and S high while both forced low |
| | | | | 1 | 1 | 1 | 0 | 0 | 0 | 0 | 0 | M and S high while both forced low |
| | | | | 1 | 0 | 1 | 0 | 0 | 0 | 0 | 0 | M and S high while both forced low, detect signal not functioning |
| | | | | 1 | 0 | 1 | 0 | 1 | 0 | 0 | 0 | M and S high while both forced low, detect signal not functioning |
| | | | | 1 | 0 | 1 | 1 | 1 | 0 | 0 | 0 | M and S high while both forced low, detect signal not functioning |
| | | | | 1 | 0 | 1 | 1 | 0 | 0 | 0 | 0 | M and S high while both forced low, detect signal not functioning |
| | | | | 1 | 0 | 0 | 1 | 0 | 0 | 0 | 1 | M already reached full high level, detect signal not functioning |
| | | | | 1 | 0 | 0 | 1 | 1 | 0 | 0 | 1 | M already reached full high level, detect signal not functioning |
| | | | | 1 | 0 | 0 | 0 | 1 | 0 | 0 | 1 | M already reached full high level, detect signal not functioning |
| | | | | 1 | 0 | 0 | 0 | 0 | 0 | 0 | 1 | M already reached full high level, detect signal not functioning |
| 1 | 0 | 0 | M detected, Hold M, Wait S release | 0 | 0 | 0 | 0 | 0 | 1 | 0 | 0 | All low, waiting for S release |
| | | | | 0 | 0 | 0 | 0 | 1 | 1 | 0 | 0 | All low, rise time delay counter not idle |
| | | | | 0 | 0 | 0 | 1 | 1 | 1 | 0 | 0 | All low, both delay counters not idle |
| | | | | 0 | 0 | 0 | 1 | 0 | 1 | 0 | 0 | All low, 4.5us delay counter not idle |
| | | | | 0 | 0 | 1 | 1 | 0 | 0 | 0 | 1 | S release detected, 4.5 us delay counter not idle |
| | | | | 0 | 0 | 1 | 1 | 1 | 0 | 0 | 1 | S release detected, both delay counters not idle |
| | | | | 0 | 0 | 1 | 0 | 1 | 0 | 0 | 1 | S release detected, rise time delay counter not idle |
| | | | | 0 | 0 | 1 | 0 | 0 | 0 | 0 | 1 | S release detected |
| | | | | 0 | 1 | 1 | 0 | 0 | 0 | 0 | 1 | S release detected, detect signal malfunctioning |
| | | | | 0 | 1 | 1 | 0 | 1 | 0 | 0 | 1 | S release detected, detect signal malfunctioning |
| | | | | 0 | 1 | 1 | 1 | 1 | 0 | 0 | 1 | S release detected, detect signal malfunctioning |
| | | | | 0 | 1 | 1 | 1 | 0 | 0 | 0 | 1 | S release detected, detect signal malfunctioning |
| | | | | 0 | 1 | 0 | 1 | 0 | 1 | 0 | 0 | |
| | | | | 0 | 1 | 0 | 1 | 1 | 1 | 0 | 0 | |
| | | | | 0 | 1 | 0 | 0 | 1 | 1 | 0 | 0 | |
| | | | | 0 | 1 | 0 | 0 | 0 | 1 | 0 | 0 | |
| | | | | 1 | 1 | 0 | 0 | 0 | 0 | 0 | 1 | M high while being forced low |
| | | | | 1 | 1 | 0 | 0 | 1 | 0 | 0 | 1 | M high while being forced low |
| | | | | 1 | 1 | 0 | 1 | 1 | 0 | 0 | 1 | M high while being forced low |
| | | | | 1 | 1 | 0 | 1 | 0 | 0 | 0 | 1 | M high while being forced low |
| | | | | 1 | 1 | 1 | 1 | 0 | 0 | 0 | 0 | M high while being forced low |
| | | | | 1 | 1 | 1 | 1 | 1 | 0 | 0 | 0 | M high while being forced low |
| | | | | 1 | 1 | 1 | 0 | 1 | 0 | 0 | 0 | M high while being forced low |
| | | | | 1 | 1 | 1 | 0 | 0 | 0 | 0 | 0 | M high while being forced low |
| | | | | 1 | 0 | 1 | 0 | 0 | 0 | 0 | 0 | M high while being forced low |
| | | | | 1 | 0 | 1 | 0 | 1 | 0 | 0 | 0 | M high while being forced low |
| | | | | 1 | 0 | 1 | 1 | 1 | 0 | 0 | 0 | M high while being forced low |
| | | | | 1 | 0 | 0 | 1 | 0 | 0 | 0 | 1 | M high while being forced low |
| | | | | 1 | 0 | 0 | 1 | 1 | 0 | 0 | 1 | M high while being forced low |
| | | | | 1 | 0 | 0 | 0 | 1 | 0 | 0 | 1 | M high while being forced low |
| | | | | 1 | 0 | 0 | 0 | 0 | 0 | 0 | 1 | M high while being forced low |

TABLE 1-continued

State Transition Table

| | | | | | | | | | | | | |
|---|---|---|---|---|---|---|---|---|---|---|---|---|
| 1 | 0 | 1 | invalid | 0 | 0 | 0 | 0 | 0 | 0 | 0 | 0 | |
| | | | | 0 | 0 | 0 | 0 | 1 | 0 | 0 | 0 | |
| | | | | 0 | 0 | 0 | 1 | 1 | 0 | 0 | 0 | |
| | | | | 0 | 0 | 0 | 1 | 0 | 0 | 0 | 0 | |
| | | | | 0 | 0 | 1 | 1 | 0 | 0 | 0 | 0 | |
| | | | | 0 | 0 | 1 | 1 | 1 | 0 | 0 | 0 | |
| | | | | 0 | 0 | 1 | 0 | 1 | 0 | 0 | 0 | |
| | | | | 0 | 0 | 1 | 0 | 0 | 0 | 0 | 0 | |
| | | | | 0 | 1 | 1 | 0 | 0 | 0 | 0 | 0 | |
| | | | | 0 | 1 | 1 | 0 | 1 | 0 | 0 | 0 | |
| | | | | 0 | 1 | 1 | 1 | 1 | 0 | 0 | 0 | |
| | | | | 0 | 1 | 1 | 1 | 0 | 0 | 0 | 0 | |
| | | | | 0 | 1 | 0 | 1 | 0 | 0 | 0 | 0 | |
| | | | | 0 | 1 | 0 | 1 | 1 | 0 | 0 | 0 | |
| | | | | 0 | 1 | 0 | 0 | 1 | 0 | 0 | 0 | |
| | | | | 0 | 1 | 0 | 0 | 0 | 0 | 0 | 0 | |
| | | | | 1 | 1 | 0 | 0 | 0 | 0 | 0 | 0 | |
| | | | | 1 | 1 | 0 | 0 | 1 | 0 | 0 | 0 | |
| | | | | 1 | 1 | 0 | 1 | 1 | 0 | 0 | 0 | |
| | | | | 1 | 1 | 0 | 1 | 0 | 0 | 0 | 0 | |
| | | | | 1 | 1 | 1 | 1 | 0 | 0 | 0 | 0 | |
| | | | | 1 | 1 | 1 | 1 | 1 | 0 | 0 | 0 | |
| | | | | 1 | 1 | 1 | 0 | 1 | 0 | 0 | 0 | |
| | | | | 1 | 1 | 1 | 0 | 0 | 0 | 0 | 0 | |
| | | | | 1 | 0 | 1 | 0 | 0 | 0 | 0 | 0 | |
| | | | | 1 | 0 | 1 | 0 | 1 | 0 | 0 | 0 | |
| | | | | 1 | 0 | 1 | 1 | 1 | 0 | 0 | 0 | |
| | | | | 1 | 0 | 1 | 1 | 0 | 0 | 0 | 0 | |
| | | | | 1 | 0 | 0 | 1 | 0 | 0 | 0 | 0 | |
| | | | | 1 | 0 | 0 | 1 | 1 | 0 | 0 | 0 | |
| | | | | 1 | 0 | 0 | 0 | 1 | 0 | 0 | 0 | |
| | | | | 1 | 0 | 0 | 0 | 0 | 0 | 0 | 0 | |
| 1 | 1 | 0 | invalid | 0 | 0 | 0 | 0 | 0 | 0 | 0 | 0 | |
| | | | | 0 | 0 | 0 | 0 | 1 | 0 | 0 | 0 | |
| | | | | 0 | 0 | 0 | 1 | 1 | 0 | 0 | 0 | |
| | | | | 0 | 0 | 0 | 1 | 0 | 0 | 0 | 0 | |
| | | | | 0 | 0 | 1 | 1 | 0 | 0 | 0 | 0 | |
| | | | | 0 | 0 | 1 | 1 | 1 | 0 | 0 | 0 | |
| | | | | 0 | 0 | 1 | 0 | 1 | 0 | 0 | 0 | |
| | | | | 0 | 0 | 1 | 0 | 0 | 0 | 0 | 0 | |
| | | | | 0 | 1 | 1 | 0 | 0 | 0 | 0 | 0 | |
| | | | | 0 | 1 | 1 | 0 | 1 | 0 | 0 | 0 | |
| | | | | 0 | 1 | 1 | 1 | 1 | 0 | 0 | 0 | |
| | | | | 0 | 1 | 1 | 1 | 0 | 0 | 0 | 0 | |
| | | | | 0 | 1 | 0 | 1 | 0 | 0 | 0 | 0 | |
| | | | | 0 | 1 | 0 | 1 | 1 | 0 | 0 | 0 | |
| | | | | 0 | 1 | 0 | 0 | 1 | 0 | 0 | 0 | |
| | | | | 0 | 1 | 0 | 0 | 0 | 0 | 0 | 0 | |
| | | | | 1 | 1 | 0 | 0 | 0 | 0 | 0 | 0 | |
| | | | | 1 | 1 | 0 | 0 | 1 | 0 | 0 | 0 | |
| | | | | 1 | 1 | 0 | 1 | 1 | 0 | 0 | 0 | |
| | | | | 1 | 1 | 0 | 1 | 0 | 0 | 0 | 0 | |
| | | | | 1 | 1 | 1 | 1 | 0 | 0 | 0 | 0 | |
| | | | | 1 | 1 | 1 | 1 | 1 | 0 | 0 | 0 | |
| | | | | 1 | 1 | 1 | 0 | 1 | 0 | 0 | 0 | |
| | | | | 1 | 1 | 1 | 0 | 0 | 0 | 0 | 0 | |
| | | | | 1 | 0 | 1 | 0 | 0 | 0 | 0 | 0 | |
| | | | | 1 | 0 | 1 | 0 | 1 | 0 | 0 | 0 | |
| | | | | 1 | 0 | 1 | 1 | 1 | 0 | 0 | 0 | |
| | | | | 1 | 0 | 1 | 1 | 0 | 0 | 0 | 0 | |
| | | | | 1 | 0 | 0 | 1 | 0 | 0 | 0 | 0 | |
| | | | | 1 | 0 | 0 | 1 | 1 | 0 | 0 | 0 | |
| | | | | 1 | 0 | 0 | 0 | 1 | 0 | 0 | 0 | |
| | | | | 1 | 0 | 0 | 0 | 0 | 0 | 0 | 0 | |
| 1 | 1 | 1 | S initiated, Hold both, Wait 4.5us | 0 | 0 | 0 | 0 | 0 | 1 | 1 | 1 | Delay not yet expired |
| | | | | 0 | 0 | 0 | 0 | 1 | 1 | 1 | 1 | Delay not yet expired |
| | | | | 0 | 0 | 0 | 1 | 1 | 0 | 1 | 1 | All low, 4.5us delay counter expired, rise time delay counter not idle |
| | | | | 0 | 0 | 0 | 1 | 0 | 0 | 1 | 1 | All low, 4.5us delay counter expired |
| | | | | 0 | 0 | 1 | 1 | 0 | 0 | 0 | 1 | 4.5us delay counter expires while S high |
| | | | | 0 | 0 | 1 | 1 | 1 | 0 | 0 | 1 | 4.5us delay counter expires while S high |
| | | | | 0 | 0 | 1 | 0 | 1 | 1 | 1 | 1 | Delay not yet expired |
| | | | | 0 | 0 | 1 | 0 | 0 | 1 | 1 | 1 | Delay not yet expired |

TABLE 1-continued

State Transition Table

| | | | | | | | | Description |
|---|---|---|---|---|---|---|---|---|
| 0 | 1 | 1 | 0 | 0 | 1 | 1 | 1 | Delay not yet expired |
| 0 | 1 | 1 | 0 | 1 | 1 | 1 | 1 | Delay not yet expired |
| 0 | 1 | 1 | 1 | 1 | 0 | 0 | 1 | 4.5us delay counter expires while S high |
| 0 | 1 | 1 | 1 | 0 | 0 | 0 | 1 | 4.5us delay counter expires while S high |
| 0 | 1 | 0 | 1 | 0 | 0 | 1 | 1 | M and S low, 4.5us delay counter expired, detect not functioning |
| 0 | 1 | 0 | 1 | 1 | 0 | 1 | 1 | M and S low, 4.5us delay counter expired, detect not functioning |
| 0 | 1 | 0 | 0 | 1 | 1 | 1 | 1 | Delay not yet expired |
| 0 | 1 | 0 | 0 | 0 | 1 | 1 | 1 | Delay not yet expired |
| 1 | 1 | 0 | 0 | 0 | 1 | 1 | 1 | Delay not yet expired |
| 1 | 1 | 0 | 0 | 1 | 1 | 1 | 1 | Delay not yet expired |
| 1 | 1 | 0 | 1 | 1 | 0 | 0 | 1 | 4.5us delay counter expires while M high |
| 1 | 1 | 0 | 1 | 0 | 0 | 0 | 1 | 4.5us delay counter expires while M high |
| 1 | 1 | 1 | 1 | 0 | 0 | 0 | 0 | 4.5us delay counter expires with M and S high while both forced low |
| 1 | 1 | 1 | 1 | 1 | 0 | 0 | 0 | 4.5us delay counter expires with M and S high while both forced low |
| 1 | 1 | 1 | 0 | 1 | 1 | 1 | 1 | Delay not yet expired |
| 1 | 1 | 1 | 0 | 0 | 1 | 1 | 1 | Delay not yet expired |
| 1 | 0 | 1 | 0 | 0 | 1 | 1 | 1 | Delay not yet expired |
| 1 | 0 | 1 | 0 | 1 | 1 | 1 | 1 | Delay not yet expired |
| 1 | 0 | 1 | 1 | 1 | 0 | 0 | 0 | 4.5us delay counter expires with M and S high while both forced low |
| 1 | 0 | 1 | 1 | 0 | 0 | 0 | 0 | 4.5us delay counter expires with M and S high while both forced low |
| 1 | 0 | 0 | 1 | 0 | 0 | 0 | 1 | 4.5us delay counter expires while M high |
| 1 | 0 | 0 | 1 | 1 | 0 | 0 | 1 | 4.5us delay counter expires while M high |
| 1 | 0 | 0 | 0 | 1 | 1 | 1 | 1 | Delay not yet expired |
| 1 | 0 | 0 | 0 | 0 | 1 | 1 | 1 | Delay not yet expired |

| PRESENT STATE | | | INPUTS | | | | | NEXT STATE | | | | ERROR |
|---|---|---|---|---|---|---|---|---|---|---|---|---|
| X | Y | R | M | D | S | T | W | X' | Y' | R' | ERROR (IF ANY) | CODE |
| 0 | 0 | 0 idle | 0 | 0 | 0 | 0 | 0 | 0 | 0 | 0 | Error: Mult-master event, not supported | 1 |
| 0 | 0 | 0 | 0 | 0 | 0 | 0 | 1 | 0 | 0 | 0 | Error: Mult-master event, not supported | 1 |
| 0 | 0 | 0 | 0 | 0 | 0 | 1 | 1 | 0 | 0 | 0 | Error: Mult-master event, not supported | 1 |
| 0 | 0 | 0 | 0 | 0 | 0 | 1 | 0 | 0 | 0 | 0 | Error: Mult-master event, not supported | 1 |
| 0 | 0 | 0 | 0 | 0 | 1 | 1 | 0 | 0 | 1 | 0 | Error: T trigger signal still active at improper time | 2 |
| 0 | 0 | 0 | 0 | 0 | 1 | 1 | 1 | 0 | 1 | 0 | Error: T and W trigger signals still active at improper time | 3 |
| 0 | 0 | 0 | 0 | 0 | 1 | 0 | 1 | 0 | 1 | 0 | Error: W trigger signal still active at improper time | 4 |
| 0 | 0 | 0 | 0 | 0 | 1 | 0 | 0 | 0 | 1 | 0 | | |
| 0 | 0 | 0 | 0 | 1 | 1 | 0 | 0 | 0 | 1 | 0 | Error: Detect hardware or timing out of spec | 5 |
| 0 | 0 | 0 | 0 | 1 | 1 | 0 | 1 | 0 | 1 | 0 | Error: Detect hardware or timing out of spec | 5 |
| 0 | 0 | 0 | 0 | 1 | 1 | 1 | 1 | 0 | 1 | 0 | Error: Detect hardware or timing out of spec | 5 |
| 0 | 0 | 0 | 0 | 1 | 1 | 1 | 0 | 0 | 1 | 0 | Error: Detect hardware or timing out of spec | 5 |
| 0 | 0 | 0 | 0 | 1 | 0 | 1 | 0 | 0 | 0 | 0 | Error: Mult-master event, not supported | 1 |
| 0 | 0 | 0 | 0 | 1 | 0 | 1 | 1 | 0 | 0 | 0 | Error: Mult-master event, not supported | 1 |

TABLE 1-continued

State Transition Table

| | | | | | | | | | | | | | |
|---|---|---|---|---|---|---|---|---|---|---|---|---|---|
| | | | | 0 | 1 | 0 | 0 | 1 | 0 | 0 | 0 | Error: Mult-master event, not supported | 1 |
| | | | | 0 | 1 | 0 | 0 | 0 | 0 | 0 | 0 | Error: Mult-master event, not supported | 1 |
| | | | | 1 | 1 | 0 | 0 | 0 | 1 | 1 | 1 | | |
| | | | | 1 | 1 | 0 | 0 | 1 | 1 | 1 | 1 | Error: W trigger signal still active at improper time | 4 |
| | | | | 1 | 1 | 0 | 1 | 1 | 1 | 1 | 1 | Error: T and W trigger signals still active at improper time | 3 |
| | | | | 1 | 1 | 0 | 1 | 0 | 1 | 1 | 1 | Error: T trigger signal still active at improper time | 2 |
| | | | | 1 | 1 | 1 | 1 | 0 | 0 | 0 | 0 | | |
| | | | | 1 | 1 | 1 | 1 | 1 | 0 | 0 | 0 | | |
| | | | | 1 | 1 | 1 | 0 | 1 | 0 | 0 | 0 | | |
| | | | | 1 | 1 | 1 | 0 | 0 | 0 | 0 | 0 | | |
| | | | | 1 | 0 | 1 | 0 | 0 | 0 | 0 | 0 | Error: Detect hardware or timing out of spec | 5 |
| | | | | 1 | 0 | 1 | 0 | 1 | 0 | 0 | 0 | Error: Detect hardware or timing out of spec | 5 |
| | | | | 1 | 0 | 1 | 1 | 1 | 0 | 0 | 0 | Error: Detect hardware or timing out of spec | 5 |
| | | | | 1 | 0 | 1 | 1 | 0 | 0 | 0 | 0 | Error: Detect hardware or timing out of spec | 5 |
| | | | | 1 | 0 | 0 | 1 | 0 | 1 | 1 | 1 | | |
| | | | | 1 | 0 | 0 | 1 | 1 | 1 | 1 | 1 | | |
| | | | | 1 | 0 | 0 | 0 | 1 | 1 | 1 | 1 | | |
| | | | | 1 | 0 | 0 | 0 | 0 | 1 | 1 | 1 | | |
| 0 | 0 | 1 | wait state | 0 | 0 | 0 | 0 | 0 | 0 | 0 | 1 | | |
| | | | | 0 | 0 | 0 | 0 | 1 | 0 | 0 | 0 | Error: M and S stuck low | 6 |
| | | | | 0 | 0 | 0 | 1 | 1 | 0 | 0 | 0 | Error: M and S stuck low | 6 |
| | | | | 0 | 0 | 0 | 1 | 0 | 0 | 0 | 1 | | |
| | | | | 0 | 0 | 1 | 1 | 0 | 0 | 0 | 1 | | |
| | | | | 0 | 0 | 1 | 1 | 1 | 0 | 0 | 0 | Error: M not high yet after rise time delay expired | 7 |
| | | | | 0 | 0 | 1 | 0 | 1 | 0 | 0 | 0 | Error: M not high yet after rise time delay expired | 7 |
| | | | | 0 | 0 | 1 | 0 | 0 | 0 | 0 | 1 | | |
| | | | | 0 | 1 | 1 | 0 | 0 | 0 | 0 | 1 | | |
| | | | | 0 | 1 | 1 | 0 | 1 | 0 | 0 | 0 | Error: M not high yet after rise time delay expired | 7 |
| | | | | 0 | 1 | 1 | 1 | 1 | 0 | 0 | 0 | Error: M not high yet after rise time delay expired | 7 |
| | | | | 0 | 1 | 1 | 1 | 0 | 0 | 0 | 1 | | |
| | | | | 0 | 1 | 0 | 1 | 0 | 0 | 0 | 1 | | |
| | | | | 0 | 1 | 0 | 1 | 1 | 0 | 0 | 0 | Error: M and S stuck low | 6 |
| | | | | 0 | 1 | 0 | 0 | 1 | 0 | 0 | 0 | Error: M and S stuck low | 6 |
| | | | | 0 | 1 | 0 | 0 | 0 | 0 | 0 | 1 | | |
| | | | | 1 | 1 | 0 | 0 | 0 | 0 | 0 | 1 | | |
| | | | | 1 | 1 | 0 | 0 | 1 | 0 | 0 | 0 | Error: S not high yet after rise time delay expired | 8 |
| | | | | 1 | 1 | 0 | 1 | 1 | 0 | 0 | 0 | Error: S not high yet after rise time delay expired | 8 |
| | | | | 1 | 1 | 0 | 1 | 0 | 0 | 0 | 1 | | |
| | | | | 1 | 1 | 1 | 1 | 0 | 0 | 0 | 1 | | |
| | | | | 1 | 1 | 1 | 1 | 1 | 0 | 0 | 0 | | |
| | | | | 1 | 1 | 1 | 0 | 1 | 0 | 0 | 0 | | |
| | | | | 1 | 1 | 1 | 0 | 0 | 0 | 0 | 1 | | |
| | | | | 1 | 0 | 1 | 0 | 0 | 0 | 0 | 1 | | |
| | | | | 1 | 0 | 1 | 0 | 1 | 0 | 0 | 0 | Error: Detect hardware or timing out of spec | 5 |
| | | | | 1 | 0 | 1 | 1 | 1 | 0 | 0 | 0 | Error: Detect hardware or timing out of spec | 5 |
| | | | | 1 | 0 | 1 | 1 | 0 | 0 | 0 | 1 | | |
| | | | | 1 | 0 | 0 | 1 | 0 | 0 | 0 | 1 | | |
| | | | | 1 | 0 | 0 | 1 | 1 | 0 | 0 | 0 | Error: S not high yet after rise time delay expired | 8 |
| | | | | 1 | 0 | 0 | 0 | 1 | 0 | 0 | 0 | Error: S not high yet after rise time delay expired | 8 |
| | | | | 1 | 0 | 0 | 0 | 0 | 0 | 0 | 1 | | |
| 0 | 1 | 0 | M initiated, Hold S, Wait M detect | 0 | 0 | 0 | 0 | 0 | 1 | 0 | | | |
| | | | | 0 | 0 | 0 | 0 | 1 | 0 | 1 | 0 | | |
| | | | | 0 | 0 | 0 | 1 | 1 | 0 | 1 | 0 | | |

TABLE 1-continued

State Transition Table

| | | | | | | | | | | | | |
|---|---|---|---|---|---|---|---|---|---|---|---|---|
| | | | | 0 | 0 | 0 | 1 | 0 | 0 | 1 | 0 | |
| | | | | 0 | 0 | 1 | 1 | 0 | 0 | 0 | 1 | Error: S not low yet or stuck high | 9 |
| | | | | 0 | 0 | 1 | 1 | 1 | 0 | 0 | 1 | Error: S not low yet or stuck high | 9 |
| | | | | 0 | 0 | 1 | 0 | 1 | 0 | 1 | 0 | |
| | | | | 0 | 0 | 1 | 0 | 0 | 0 | 1 | 0 | |
| | | | | 0 | 1 | 1 | 0 | 0 | 0 | 1 | 0 | |
| | | | | 0 | 1 | 1 | 0 | 1 | 0 | 1 | 0 | |
| | | | | 0 | 1 | 1 | 1 | 1 | 0 | 0 | 1 | Error: Detect hardware or timing out of spec | 5 |
| | | | | 0 | 1 | 1 | 1 | 0 | 0 | 0 | 1 | Error: Detect hardware or timing out of spec | 5 |
| | | | | 0 | 1 | 0 | 1 | 0 | 1 | 0 | 0 | |
| | | | | 0 | 1 | 0 | 1 | 1 | 1 | 0 | 0 | |
| | | | | 0 | 1 | 0 | 0 | 1 | 0 | 1 | 0 | |
| | | | | 0 | 1 | 0 | 0 | 0 | 0 | 1 | 0 | |
| | | | | 1 | 1 | 0 | 0 | 0 | 0 | 1 | 0 | |
| | | | | 1 | 1 | 0 | 0 | 1 | 0 | 1 | 0 | |
| | | | | 1 | 1 | 0 | 1 | 1 | 0 | 0 | 1 | Error: Detect hardware or timing out of spec | 5 |
| | | | | 1 | 1 | 0 | 1 | 0 | 0 | 0 | 1 | Error: Detect hardware or timing out of spec | 5 |
| | | | | 1 | 1 | 1 | 1 | 0 | 0 | 0 | 1 | Error: Detect hardware or timing out of spec | 5 |
| | | | | 1 | 1 | 1 | 1 | 1 | 0 | 0 | 1 | Error: Detect hardware or timing out of spec | 5 |
| | | | | 1 | 1 | 1 | 0 | 1 | 0 | 1 | 0 | |
| | | | | 1 | 1 | 1 | 0 | 0 | 0 | 1 | 0 | |
| | | | | 1 | 0 | 1 | 0 | 0 | 0 | 1 | 0 | |
| | | | | 1 | 0 | 1 | 0 | 1 | 0 | 1 | 0 | |
| | | | | 1 | 0 | 1 | 1 | 1 | 0 | 0 | 1 | Error: Detect hardware or timing out of spec | 5 |
| | | | | 1 | 0 | 1 | 1 | 0 | 0 | 0 | 1 | Error: Detect hardware or timing out of spec | 5 |
| | | | | 1 | 0 | 0 | 1 | 0 | 0 | 0 | 1 | Error: Detect hardware or timing out of spec | 5 |
| | | | | 1 | 0 | 0 | 1 | 1 | 0 | 0 | 1 | Error: Detect hardware or timing out of spec | 5 |
| | | | | 1 | 0 | 0 | 0 | 1 | 0 | 1 | 0 | |
| | | | | 1 | 0 | 0 | 0 | 0 | 0 | 1 | 0 | |
| 0 | 1 | 1 | 4.5us expired, Hold S, Wait M detect | 0 | 0 | 0 | 0 | 0 | 0 | 1 | 1 | |
| | | | | 0 | 0 | 0 | 0 | 1 | 0 | 1 | 1 | |
| | | | | 0 | 0 | 0 | 1 | 1 | 0 | 1 | 1 | |
| | | | | 0 | 0 | 0 | 1 | 0 | 0 | 1 | 1 | |
| | | | | 0 | 0 | 1 | 1 | 0 | 0 | 0 | 1 | Error: S forced high | 9 |
| | | | | 0 | 0 | 1 | 1 | 1 | 0 | 0 | 1 | Error: S forced high | 9 |
| | | | | 0 | 0 | 1 | 0 | 1 | 0 | 0 | 1 | Error: S forced high | 9 |
| | | | | 0 | 0 | 1 | 0 | 0 | 0 | 0 | 1 | Error: S forced high | 9 |
| | | | | 0 | 1 | 1 | 0 | 0 | 0 | 0 | 1 | Error: S forced high | 9 |
| | | | | 0 | 1 | 1 | 0 | 1 | 0 | 0 | 1 | Error: S forced high | 9 |
| | | | | 0 | 1 | 1 | 1 | 1 | 0 | 0 | 1 | Error: S forced high | 9 |
| | | | | 0 | 1 | 1 | 1 | 0 | 0 | 0 | 1 | Error: S forced high | 9 |
| | | | | 0 | 1 | 0 | 1 | 0 | 1 | 0 | 0 | |
| | | | | 0 | 1 | 0 | 1 | 1 | 1 | 0 | 0 | |
| | | | | 0 | 1 | 0 | 0 | 1 | 1 | 0 | 0 | |
| | | | | 0 | 1 | 0 | 0 | 0 | 1 | 0 | 0 | |
| | | | | 1 | 1 | 0 | 0 | 0 | 0 | 0 | 1 | Error: Detect hardware or timing out of spec | 5 |
| | | | | 1 | 1 | 0 | 0 | 1 | 0 | 0 | 1 | Error: Detect hardware or timing out of spec | 5 |
| | | | | 1 | 1 | 0 | 1 | 1 | 0 | 0 | 1 | Error: Detect hardware or timing out of spec | 5 |
| | | | | 1 | 1 | 0 | 1 | 0 | 0 | 0 | 1 | Error: Detect hardware or timing out of spec | 5 |
| | | | | 1 | 1 | 1 | 1 | 0 | 0 | 0 | 0 | Error: M and S forced high | 12 |
| | | | | 1 | 1 | 1 | 1 | 1 | 0 | 0 | 0 | Error: M and S forced high | 12 |
| | | | | 1 | 1 | 1 | 0 | 1 | 0 | 0 | 0 | Error: M and S forced high | 12 |
| | | | | 1 | 1 | 1 | 0 | 0 | 0 | 0 | 0 | Error: M and S forced high | 12 |
| | | | | 1 | 0 | 1 | 0 | 0 | 0 | 0 | 0 | Error: M and S forced high | 12 |
| | | | | 1 | 0 | 1 | 0 | 1 | 0 | 0 | 0 | Error: M and S forced high | 12 |
| | | | | 1 | 0 | 1 | 1 | 1 | 0 | 0 | 0 | Error: M and S forced high | 12 |
| | | | | 1 | 0 | 1 | 1 | 0 | 0 | 0 | 0 | Error: M and S forced high | 12 |
| | | | | 1 | 0 | 0 | 1 | 0 | 0 | 0 | 1 | Error: Detect hardware or timing out of spec | 5 |
| | | | | 1 | 0 | 0 | 1 | 1 | 0 | 0 | 1 | Error: Detect hardware or | |

TABLE 1-continued

State Transition Table

| | | | | | | | | | | | | | |
|---|---|---|---|---|---|---|---|---|---|---|---|---|---|
| | | | | 1 | 0 | 0 | 0 | 1 | 0 | 0 | 1 | Error: Detect hardware or timing out of spec | 5 |
| | | | | 1 | 0 | 0 | 0 | 0 | 0 | 0 | 1 | Error: Detect hardware or timing out of spec | 5 |
| 1 | 0 | 0 | M detected, Hold M, Wait S release | 0 | 0 | 0 | 0 | 0 | 1 | 0 | 0 | | |
| | | | | 0 | 0 | 0 | 0 | 1 | 1 | 0 | 0 | Error: W trigger signal still active at improper time | 4 |
| | | | | 0 | 0 | 0 | 1 | 1 | 1 | 0 | 0 | Error: T and W trigger signals still active at improper time | 3 |
| | | | | 0 | 0 | 0 | 1 | 0 | 1 | 0 | 0 | Error: T trigger signal still active at improper time | 2 |
| | | | | 0 | 0 | 1 | 1 | 0 | 0 | 0 | 1 | Error: T trigger signal still active at improper time | 2 |
| | | | | 0 | 0 | 1 | 1 | 1 | 0 | 0 | 1 | Error: T and W trigger signals still active at improper time | 3 |
| | | | | 0 | 0 | 1 | 0 | 1 | 0 | 0 | 1 | Error: W trigger signal still active at improper time | 4 |
| | | | | 0 | 0 | 1 | 0 | 0 | 0 | 0 | 1 | | |
| | | | | 0 | 1 | 1 | 0 | 0 | 0 | 0 | 1 | Error: Detect hardware or timing out of spec | 5 |
| | | | | 0 | 1 | 1 | 0 | 1 | 0 | 0 | 1 | Error: Detect hardware or timing out of spec | 5 |
| | | | | 0 | 1 | 1 | 1 | 1 | 0 | 0 | 1 | Error: Detect hardware or timing out of spec | 5 |
| | | | | 0 | 1 | 1 | 1 | 0 | 0 | 0 | 1 | Error: Detect hardware or timing out of spec | 5 |
| | | | | 0 | 1 | 0 | 1 | 0 | 1 | 0 | 0 | | |
| | | | | 0 | 1 | 0 | 1 | 1 | 1 | 0 | 0 | | |
| | | | | 0 | 1 | 0 | 0 | 1 | 1 | 0 | 0 | | |
| | | | | 0 | 1 | 0 | 0 | 0 | 1 | 0 | 0 | | |
| | | | | 1 | 1 | 0 | 0 | 0 | 0 | 0 | 1 | Error: M forced high | 10 |
| | | | | 1 | 1 | 0 | 0 | 1 | 0 | 0 | 1 | Error: M forced high | 10 |
| | | | | 1 | 1 | 0 | 1 | 1 | 0 | 0 | 1 | Error: M forced high | 10 |
| | | | | 1 | 1 | 0 | 1 | 0 | 0 | 0 | 1 | Error: M forced high | 10 |
| | | | | 1 | 1 | 1 | 1 | 0 | 0 | 0 | 0 | Error: M forced high | 10 |
| | | | | 1 | 1 | 1 | 1 | 1 | 0 | 0 | 0 | Error: M forced high | 10 |
| | | | | 1 | 1 | 1 | 0 | 1 | 0 | 0 | 0 | Error: M forced high | 10 |
| | | | | 1 | 1 | 1 | 0 | 0 | 0 | 0 | 0 | Error: M forced high | 10 |
| | | | | 1 | 0 | 1 | 0 | 0 | 0 | 0 | 0 | Error: M forced high | 10 |
| | | | | 1 | 0 | 1 | 0 | 1 | 0 | 0 | 0 | Error: M forced high | 10 |
| | | | | 1 | 0 | 1 | 1 | 1 | 0 | 0 | 0 | Error: M forced high | 10 |
| | | | | 1 | 0 | 1 | 1 | 0 | 0 | 0 | 0 | Error: M forced high | 10 |
| | | | | 1 | 0 | 0 | 1 | 0 | 0 | 0 | 1 | Error: M forced high | 10 |
| | | | | 1 | 0 | 0 | 1 | 1 | 0 | 0 | 1 | Error: M forced high | 10 |
| | | | | 1 | 0 | 0 | 0 | 1 | 0 | 0 | 1 | Error: M forced high | 10 |
| | | | | 1 | 0 | 0 | 0 | 0 | 0 | 0 | 1 | Error: M forced high | 10 |
| 1 | 0 | 1 | invalid | 0 | 0 | 0 | 0 | 0 | 0 | 0 | 0 | Error: Invalid state | 11 |
| | | | | 0 | 0 | 0 | 0 | 1 | 0 | 0 | 0 | Error: Invalid state | 11 |
| | | | | 0 | 0 | 0 | 1 | 1 | 0 | 0 | 0 | Error: Invalid state | 11 |
| | | | | 0 | 0 | 0 | 1 | 0 | 0 | 0 | 0 | Error: Invalid state | 11 |
| | | | | 0 | 0 | 1 | 1 | 0 | 0 | 0 | 0 | Error: Invalid state | 11 |
| | | | | 0 | 0 | 1 | 1 | 1 | 0 | 0 | 0 | Error: Invalid state | 11 |
| | | | | 0 | 0 | 1 | 0 | 1 | 0 | 0 | 0 | Error: Invalid state | 11 |
| | | | | 0 | 0 | 1 | 0 | 0 | 0 | 0 | 0 | Error: Invalid state | 11 |
| | | | | 0 | 1 | 1 | 0 | 0 | 0 | 0 | 0 | Error: Invalid state | 11 |
| | | | | 0 | 1 | 1 | 0 | 1 | 0 | 0 | 0 | Error: Invalid state | 11 |
| | | | | 0 | 1 | 1 | 1 | 1 | 0 | 0 | 0 | Error: Invalid state | 11 |
| | | | | 0 | 1 | 1 | 1 | 0 | 0 | 0 | 0 | Error: Invalid state | 11 |
| | | | | 0 | 1 | 0 | 1 | 0 | 0 | 0 | 0 | Error: Invalid state | 11 |
| | | | | 0 | 1 | 0 | 1 | 1 | 0 | 0 | 0 | Error: Invalid state | 11 |
| | | | | 0 | 1 | 0 | 0 | 1 | 0 | 0 | 0 | Error: Invalid state | 11 |
| | | | | 0 | 1 | 0 | 0 | 0 | 0 | 0 | 0 | Error: Invalid state | 11 |
| | | | | 1 | 1 | 0 | 0 | 0 | 0 | 0 | 0 | Error: Invalid state | 11 |
| | | | | 1 | 1 | 0 | 0 | 1 | 0 | 0 | 0 | Error: Invalid state | 11 |
| | | | | 1 | 1 | 0 | 1 | 1 | 0 | 0 | 0 | Error: Invalid state | 11 |
| | | | | 1 | 1 | 0 | 1 | 0 | 0 | 0 | 0 | Error: Invalid state | 11 |
| | | | | 1 | 1 | 1 | 1 | 1 | 0 | 0 | 0 | Error: Invalid state | 11 |
| | | | | 1 | 1 | 1 | 0 | 1 | 0 | 0 | 0 | Error: Invalid state | 11 |
| | | | | 1 | 1 | 1 | 0 | 0 | 0 | 0 | 0 | Error: Invalid state | 11 |
| | | | | 1 | 0 | 1 | 0 | 0 | 0 | 0 | 0 | Error: Invalid state | 11 |

TABLE 1-continued

State Transition Table

| | | | | | | | | | | | | | |
|---|---|---|---|---|---|---|---|---|---|---|---|---|---|
| | | | | 1 | 0 | 1 | 0 | 1 | 0 | 0 | 0 | Error: Invalid state | 11 |
| | | | | 1 | 0 | 1 | 1 | 1 | 0 | 0 | 0 | Error: Invalid state | 11 |
| | | | | 1 | 0 | 1 | 1 | 0 | 0 | 0 | 0 | Error: Invalid state | 11 |
| | | | | 1 | 0 | 0 | 1 | 0 | 0 | 0 | 0 | Error: Invalid state | 11 |
| | | | | 1 | 0 | 0 | 1 | 1 | 0 | 0 | 0 | Error: Invalid state | 11 |
| | | | | 1 | 0 | 0 | 0 | 1 | 0 | 0 | 0 | Error: Invalid state | 11 |
| | | | | 1 | 0 | 0 | 0 | 0 | 0 | 0 | 0 | Error: Invalid state | 11 |
| 1 | 1 | 0 | invalid | 0 | 0 | 0 | 0 | 0 | 0 | 0 | 0 | Error: Invalid state | 11 |
| | | | | 0 | 0 | 0 | 0 | 1 | 0 | 0 | 0 | Error: Invalid state | 11 |
| | | | | 0 | 0 | 0 | 1 | 1 | 0 | 0 | 0 | Error: Invalid state | 11 |
| | | | | 0 | 0 | 0 | 1 | 0 | 0 | 0 | 0 | Error: Invalid state | 11 |
| | | | | 0 | 0 | 1 | 1 | 0 | 0 | 0 | 0 | Error: Invalid state | 11 |
| | | | | 0 | 0 | 1 | 1 | 1 | 0 | 0 | 0 | Error: Invalid state | 11 |
| | | | | 0 | 0 | 1 | 0 | 1 | 0 | 0 | 0 | Error: Invalid state | 11 |
| | | | | 0 | 0 | 1 | 0 | 0 | 0 | 0 | 0 | Error: Invalid state | 11 |
| | | | | 0 | 1 | 1 | 0 | 0 | 0 | 0 | 0 | Error: Invalid state | 11 |
| | | | | 0 | 1 | 1 | 0 | 1 | 0 | 0 | 0 | Error: Invalid state | 11 |
| | | | | 0 | 1 | 1 | 1 | 1 | 0 | 0 | 0 | Error: Invalid state | 11 |
| | | | | 0 | 1 | 1 | 1 | 0 | 0 | 0 | 0 | Error: Invalid state | 11 |
| | | | | 0 | 1 | 0 | 1 | 0 | 0 | 0 | 0 | Error: Invalid state | 11 |
| | | | | 0 | 1 | 0 | 1 | 1 | 0 | 0 | 0 | Error: Invalid state | 11 |
| | | | | 0 | 1 | 0 | 0 | 1 | 0 | 0 | 0 | Error: Invalid state | 11 |
| | | | | 0 | 1 | 0 | 0 | 0 | 0 | 0 | 0 | Error: Invalid state | 11 |
| | | | | 1 | 1 | 0 | 0 | 0 | 0 | 0 | 0 | Error: Invalid state | 11 |
| | | | | 1 | 1 | 0 | 0 | 1 | 0 | 0 | 0 | Error: Invalid state | 11 |
| | | | | 1 | 1 | 0 | 1 | 1 | 0 | 0 | 0 | Error: Invalid state | 11 |
| | | | | 1 | 1 | 0 | 1 | 0 | 0 | 0 | 0 | Error: Invalid state | 11 |
| | | | | 1 | 1 | 1 | 1 | 0 | 0 | 0 | 0 | Error: Invalid state | 11 |
| | | | | 1 | 1 | 1 | 1 | 1 | 0 | 0 | 0 | Error: Invalid state | 11 |
| | | | | 1 | 1 | 1 | 0 | 1 | 0 | 0 | 0 | Error: Invalid state | 11 |
| | | | | 1 | 1 | 1 | 0 | 0 | 0 | 0 | 0 | Error: Invalid state | 11 |
| | | | | 1 | 0 | 1 | 0 | 0 | 0 | 0 | 0 | Error: Invalid state | 11 |
| | | | | 1 | 0 | 1 | 0 | 1 | 0 | 0 | 0 | Error: Invalid state | 11 |
| | | | | 1 | 0 | 1 | 1 | 1 | 0 | 0 | 0 | Error: Invalid state | 11 |
| | | | | 1 | 0 | 1 | 1 | 0 | 0 | 0 | 0 | Error: Invalid state | 11 |
| | | | | 1 | 0 | 0 | 1 | 0 | 0 | 0 | 0 | Error: Invalid state | 11 |
| | | | | 1 | 0 | 0 | 1 | 1 | 0 | 0 | 0 | Error: Invalid state | 11 |
| | | | | 1 | 0 | 0 | 0 | 1 | 0 | 0 | 0 | Error: Invalid state | 11 |
| | | | | 1 | 0 | 0 | 0 | 0 | 0 | 0 | 0 | Error: Invalid state | 11 |
| 1 | 1 | 1 | S initiated, Hold both, Wait 4.5us | 0 | 0 | 0 | 0 | 0 | 1 | 1 | 1 | | |
| | | | | 0 | 0 | 0 | 0 | 1 | 1 | 1 | 1 | | |
| | | | | 0 | 0 | 0 | 1 | 1 | 0 | 1 | 1 | Error: W trigger signal still active at improper time | 4 |
| | | | | 0 | 0 | 0 | 1 | 0 | 0 | 1 | 1 | | |
| | | | | 0 | 0 | 1 | 1 | 0 | 0 | 0 | 1 | Error: S forced high | 9 |
| | | | | 0 | 0 | 1 | 1 | 1 | 0 | 0 | 1 | Error: S forced high | 9 |
| | | | | 0 | 0 | 1 | 0 | 1 | 1 | 1 | 1 | | |
| | | | | 0 | 0 | 1 | 0 | 0 | 1 | 1 | 1 | | |
| | | | | 0 | 1 | 1 | 0 | 0 | 1 | 1 | 1 | | |
| | | | | 0 | 1 | 1 | 0 | 1 | 1 | 1 | 1 | | |
| | | | | 0 | 1 | 1 | 1 | 1 | 0 | 0 | 1 | Error: S forced high | 9 |
| | | | | 0 | 1 | 1 | 1 | 0 | 0 | 0 | 1 | Error: S forced high | 9 |
| | | | | 0 | 1 | 0 | 1 | 0 | 0 | 1 | 1 | Error: Detect hardware or timing out of spec | 5 |
| | | | | 0 | 1 | 0 | 1 | 1 | 0 | 1 | 1 | Error: Detect hardware or timing out of spec | 5 |
| | | | | 0 | 1 | 0 | 0 | 1 | 1 | 1 | 1 | | |
| | | | | 0 | 1 | 0 | 0 | 0 | 1 | 1 | 1 | | |
| | | | | 1 | 1 | 0 | 0 | 0 | 1 | 1 | 1 | | |
| | | | | 1 | 1 | 0 | 0 | 1 | 1 | 1 | 1 | | |
| | | | | 1 | 1 | 0 | 1 | 1 | 0 | 0 | 1 | Error: M forced high | 10 |
| | | | | 1 | 1 | 0 | 1 | 0 | 0 | 0 | 1 | Error: M forced high | 10 |
| | | | | 1 | 1 | 1 | 1 | 0 | 0 | 0 | 0 | Error: M and S forced high | 12 |
| | | | | 1 | 1 | 1 | 1 | 1 | 0 | 0 | 0 | Error: M and S forced high | 12 |
| | | | | 1 | 1 | 1 | 0 | 1 | 1 | 1 | 1 | | |
| | | | | 1 | 1 | 1 | 0 | 0 | 1 | 1 | 1 | | |
| | | | | 1 | 0 | 1 | 0 | 0 | 1 | 1 | 1 | | |
| | | | | 1 | 0 | 1 | 0 | 1 | 1 | 1 | 1 | | |
| | | | | 1 | 0 | 1 | 1 | 0 | 0 | 0 | 0 | Error: M and S forced high | 12 |
| | | | | 1 | 0 | 1 | 1 | 0 | 0 | 0 | 0 | Error: M and S forced high | 12 |
| | | | | 1 | 0 | 0 | 1 | 0 | 0 | 0 | 1 | Error: M forced high | 10 |
| | | | | 1 | 0 | 0 | 1 | 1 | 0 | 0 | 1 | Error: M forced high | 10 |
| | | | | 1 | 0 | 0 | 0 | 1 | 1 | 1 | 1 | | |
| | | | | 1 | 0 | 0 | 0 | 0 | 1 | 1 | 1 | | |

TABLE 2

Karnaugh Maps

| | | | | 0 | 1 | 1 | 0 | 0 | 1 | 1 | 0 | R |
|---|---|---|---|---|---|---|---|---|---|---|---|---|
| | | | | 0 | 0 | 1 | 1 | 1 | 1 | 0 | 0 | Y |
| | | | | 0 | 0 | 0 | 0 | 1 | 1 | 1 | 1 | X |

X'

| 0 | 0 | 0 | 0 | 0 | 0 | 0 | 0 | 0 | 0 | 1 | 0 | 1 |
|---|---|---|---|---|---|---|---|---|---|---|---|---|
| 0 | 0 | 0 | 0 | 1 | 0 | 0 | 0 | 0 | 1 | 0 | 1 | |
| 0 | 0 | 0 | 1 | 1 | 0 | 0 | 0 | 0 | 0 | 0 | 1 | |
| 0 | 0 | 0 | 1 | 0 | 0 | 0 | 0 | 0 | 0 | 0 | 1 | |
| 0 | 0 | 1 | 1 | 0 | 0 | 0 | 0 | 0 | 0 | 0 | 0 | |
| 0 | 0 | 1 | 0 | 1 | 0 | 0 | 0 | 0 | 1 | 0 | 0 | |
| 0 | 0 | 1 | 0 | 0 | 0 | 0 | 0 | 0 | 1 | 0 | 0 | |
| 0 | 1 | 1 | 0 | 0 | 0 | 0 | 0 | 0 | 1 | 0 | 0 | |
| 0 | 1 | 1 | 0 | 1 | 0 | 0 | 0 | 0 | 1 | 0 | 0 | |
| 0 | 1 | 1 | 1 | 1 | 0 | 0 | 0 | 0 | 0 | 0 | 0 | |
| 0 | 1 | 1 | 1 | 0 | 0 | 0 | 0 | 0 | 0 | 0 | 0 | |
| 0 | 1 | 0 | 1 | 0 | 0 | 1 | 1 | 0 | 0 | 0 | 1 | |
| 0 | 1 | 0 | 1 | 1 | 0 | 1 | 1 | 0 | 0 | 0 | 1 | |
| 0 | 1 | 0 | 0 | 1 | 0 | 1 | 0 | 0 | 1 | 0 | 1 | |
| 0 | 1 | 0 | 0 | 0 | 0 | 1 | 0 | 0 | 1 | 0 | 1 | |
| 1 | 1 | 0 | 0 | 0 | 1 | 0 | 0 | 0 | 1 | 0 | 0 | |
| 1 | 1 | 0 | 0 | 1 | 0 | 0 | 0 | 0 | 1 | 0 | 0 | |
| 1 | 1 | 0 | 1 | 1 | 1 | 0 | 0 | 0 | 0 | 0 | 0 | |
| 1 | 1 | 0 | 1 | 0 | 1 | 0 | 0 | 0 | 0 | 0 | 0 | |
| 1 | 1 | 1 | 1 | 0 | 0 | 0 | 0 | 0 | 0 | 0 | 0 | |
| 1 | 1 | 1 | 1 | 1 | 0 | 0 | 0 | 0 | 0 | 0 | 0 | |
| 1 | 1 | 1 | 0 | 1 | 0 | 0 | 0 | 0 | 1 | 0 | 0 | |
| 1 | 1 | 1 | 0 | 0 | 0 | 0 | 0 | 0 | 1 | 0 | 0 | |
| 1 | 0 | 0 | 0 | 0 | 0 | 0 | 0 | 0 | 1 | 0 | 0 | |
| 1 | 0 | 1 | 0 | 0 | 0 | 0 | 0 | 0 | 1 | 0 | 0 | |
| 1 | 0 | 1 | 1 | 0 | 0 | 0 | 0 | 0 | 1 | 0 | 0 | |
| 1 | 0 | 1 | 1 | 1 | 0 | 0 | 0 | 0 | 0 | 0 | 0 | |
| 1 | 0 | 1 | 1 | 0 | 0 | 0 | 0 | 0 | 0 | 0 | 0 | |
| 1 | 0 | 0 | 1 | 0 | 1 | 0 | 0 | 0 | 0 | 0 | 0 | |
| 1 | 0 | 0 | 1 | 1 | 0 | 0 | 0 | 0 | 0 | 0 | 0 | |
| 1 | 0 | 0 | 0 | 1 | 1 | 0 | 0 | 0 | 1 | 0 | 0 | |
| 1 | 0 | 0 | 0 | 0 | 1 | 0 | 0 | 0 | 1 | 0 | 0 | |
| M | D | S | T | W | | | | | | | | |

Y'

| 0 | 0 | 0 | 0 | 0 | 0 | 1 | 1 | 0 | 1 | 0 | 0 |
|---|---|---|---|---|---|---|---|---|---|---|---|
| 0 | 0 | 0 | 0 | 1 | 0 | 0 | 1 | 1 | 0 | 1 | 0 | 0 |
| 0 | 0 | 0 | 1 | 1 | 0 | 0 | 1 | 1 | 0 | 1 | 0 | 0 |
| 0 | 0 | 0 | 1 | 0 | 0 | 0 | 1 | 1 | 1 | 0 | 0 |
| 0 | 0 | 1 | 1 | 0 | 1 | 0 | 0 | 0 | 0 | 0 | 0 |
| 0 | 0 | 1 | 0 | 1 | 1 | 0 | 0 | 0 | 0 | 0 | 0 |
| 0 | 0 | 1 | 0 | 1 | 1 | 0 | 0 | 1 | 1 | 0 | 0 |
| 0 | 0 | 1 | 0 | 0 | 1 | 0 | 0 | 1 | 1 | 0 | 0 |
| 0 | 1 | 1 | 0 | 0 | 1 | 0 | 0 | 1 | 1 | 0 | 0 |
| 0 | 1 | 1 | 0 | 1 | 1 | 0 | 0 | 1 | 1 | 0 | 0 |
| 0 | 1 | 1 | 1 | 1 | 0 | 0 | 0 | 0 | 0 | 0 | 0 |
| 0 | 1 | 1 | 1 | 0 | 1 | 0 | 0 | 0 | 0 | 0 | 0 |
| 0 | 1 | 0 | 1 | 0 | 0 | 0 | 0 | 0 | 1 | 0 | 0 |
| 0 | 1 | 0 | 1 | 1 | 0 | 0 | 0 | 0 | 1 | 0 | 0 |
| 0 | 1 | 0 | 0 | 1 | 0 | 0 | 0 | 1 | 0 | 0 | 0 |
| 0 | 1 | 0 | 0 | 0 | 0 | 0 | 0 | 1 | 0 | 0 | 0 |
| 1 | 1 | 0 | 0 | 0 | 1 | 0 | 1 | 1 | 0 | 0 | 0 |
| 1 | 1 | 0 | 0 | 1 | 1 | 0 | 1 | 1 | 0 | 0 | 0 |
| 1 | 1 | 0 | 1 | 1 | 1 | 0 | 0 | 0 | 0 | 0 | 0 |
| 1 | 1 | 0 | 1 | 0 | 1 | 0 | 0 | 0 | 0 | 0 | 0 |
| 1 | 1 | 1 | 1 | 0 | 0 | 0 | 0 | 0 | 0 | 0 | 0 |
| 1 | 1 | 1 | 1 | 1 | 0 | 0 | 0 | 0 | 0 | 0 | 0 |
| 1 | 1 | 1 | 0 | 1 | 0 | 0 | 0 | 1 | 1 | 0 | 0 |
| 1 | 1 | 1 | 0 | 0 | 0 | 0 | 0 | 1 | 1 | 0 | 0 |
| 1 | 0 | 1 | 0 | 0 | 0 | 0 | 0 | 1 | 1 | 0 | 0 |
| 1 | 0 | 1 | 0 | 1 | 0 | 0 | 0 | 1 | 1 | 0 | 0 |
| 1 | 0 | 1 | 1 | 1 | 0 | 0 | 0 | 0 | 0 | 0 | 0 |
| 1 | 0 | 1 | 1 | 0 | 0 | 0 | 0 | 0 | 0 | 0 | 0 |
| 1 | 0 | 0 | 1 | 0 | 1 | 0 | 0 | 0 | 0 | 0 | 0 |
| 1 | 0 | 0 | 1 | 1 | 1 | 0 | 0 | 0 | 0 | 0 | 0 |
| 1 | 0 | 0 | 0 | 1 | 1 | 0 | 0 | 1 | 0 | 0 | 0 |
| 1 | 0 | 0 | 0 | 0 | 1 | 0 | 0 | 1 | 0 | 0 | 0 |
| M | D | S | T | W | | | | | | | | |

R'

| 0 | 0 | 0 | 0 | 0 | 0 | 1 | 1 | 0 | 1 | 0 | 0 |
|---|---|---|---|---|---|---|---|---|---|---|---|
| 0 | 0 | 0 | 0 | 1 | 0 | 0 | 1 | 0 | 0 | 1 | 0 | 0 |

TABLE 2-continued

Karnaugh Maps

| | | | | 0 | 1 | 1 | 0 | 0 | 1 | 1 | 0 | R |
|---|---|---|---|---|---|---|---|---|---|---|---|---|
| | | | | 0 | 0 | 1 | 1 | 1 | 1 | 0 | 0 | Y |
| | | | | 0 | 0 | 0 | 0 | 1 | 1 | 1 | 1 | X |

| 0 | 0 | 0 | 1 | 1 | 0 | 0 | 1 | 0 | 0 | 1 | 0 | 0 |
|---|---|---|---|---|---|---|---|---|---|---|---|---|
| 0 | 0 | 0 | 1 | 0 | 0 | 1 | 1 | 0 | 0 | 1 | 0 | 0 |
| 0 | 0 | 1 | 1 | 0 | 0 | 1 | 1 | 0 | 1 | 0 | 1 | |
| 0 | 0 | 1 | 1 | 1 | 0 | 0 | 1 | 1 | 0 | 1 | 0 | 1 |
| 0 | 0 | 1 | 0 | 1 | 0 | 0 | 1 | 0 | 0 | 1 | 0 | 1 |
| 0 | 0 | 1 | 0 | 0 | 0 | 1 | 1 | 0 | 0 | 1 | 0 | 1 |
| 0 | 1 | 1 | 0 | 0 | 0 | 1 | 1 | 0 | 0 | 1 | 0 | 1 |
| 0 | 1 | 1 | 0 | 1 | 0 | 1 | 0 | 1 | 0 | 1 | 0 | 1 |
| 0 | 1 | 1 | 1 | 1 | 0 | 0 | 1 | 1 | 0 | 1 | 0 | 1 |
| 0 | 1 | 1 | 1 | 0 | 0 | 1 | 1 | 1 | 0 | 1 | 0 | 1 |
| 0 | 1 | 0 | 1 | 0 | 0 | 1 | 0 | 0 | 0 | 1 | 0 | 0 |
| 0 | 1 | 0 | 1 | 1 | 0 | 0 | 0 | 0 | 0 | 1 | 0 | 0 |
| 0 | 1 | 0 | 0 | 1 | 0 | 0 | 0 | 0 | 0 | 1 | 0 | 0 |
| 0 | 1 | 0 | 0 | 0 | 1 | 0 | 0 | 0 | 0 | 1 | 0 | 0 |
| 1 | 1 | 0 | 0 | 0 | 1 | 1 | 1 | 0 | 0 | 1 | 0 | 1 |
| 1 | 1 | 0 | 0 | 1 | 1 | 0 | 1 | 1 | 0 | 1 | 0 | 1 |
| 1 | 1 | 0 | 1 | 1 | 0 | 1 | 1 | 1 | 0 | 1 | 0 | 1 |
| 1 | 1 | 0 | 1 | 0 | 1 | 1 | 1 | 1 | 0 | 1 | 0 | 1 |
| 1 | 1 | 1 | 1 | 0 | 0 | 1 | 0 | 1 | 0 | 0 | 0 | 0 |
| 1 | 1 | 1 | 1 | 1 | 0 | 0 | 1 | 0 | 0 | 0 | 0 | 0 |
| 1 | 1 | 1 | 0 | 1 | 0 | 0 | 0 | 0 | 0 | 1 | 0 | 0 |
| 1 | 1 | 1 | 0 | 0 | 0 | 1 | 0 | 0 | 0 | 1 | 0 | 0 |
| 1 | 0 | 1 | 0 | 0 | 0 | 1 | 0 | 0 | 0 | 1 | 0 | 0 |
| 1 | 0 | 1 | 0 | 1 | 0 | 1 | 0 | 0 | 0 | 1 | 0 | 0 |
| 1 | 0 | 1 | 1 | 1 | 0 | 0 | 1 | 0 | 0 | 0 | 0 | 0 |
| 1 | 0 | 1 | 1 | 0 | 1 | 0 | 1 | 0 | 0 | 0 | 0 | 0 |
| 1 | 0 | 0 | 1 | 0 | 1 | 1 | 1 | 1 | 0 | 1 | 0 | 1 |
| 1 | 0 | 0 | 1 | 1 | 0 | 1 | 1 | 0 | 1 | 0 | 1 | |
| 1 | 0 | 0 | 0 | 1 | 1 | 0 | 1 | 1 | 0 | 1 | 0 | 1 |
| 1 | 0 | 0 | 0 | 0 | 1 | 1 | 1 | 0 | 0 | 1 | 0 | 1 |
| M | D | S | T | W | | | | | | | | |

The equations for Karnaugh maps shown in Table 2 are:

X'=(not(x) and not(y) and not(r) and m and d and not(s)) or
(not(x) and not(y) and not(r) and m and not(d) and not(s)) or
(not(x) and y and r and not(m) and d and not(s)) or
(not(x) and y and not(r) and not(m) and d and not(s) and t) or
(x and y and r and not(m) and not(d) and not(s) and not(t)) or
(x and y and r and not(m) and d and not(s) and not(t)) or
(x and not(y) and not(r) and not(m) and not(d) and not(s)) or
(x and not(y) and not(r) and not(m) and d and not(s)) or
(x and y and r and not(m) and s and not(t)) or
(x and y and r and m and d and not(s) and not(t)) or
(x and y and r and m and s and not(t)) or
(x and y and r and m and not(d) and not(s) and not(t));

Y'=(not(x) and not(y) and not(r) and not(m) and s) or
(not(x) and not(y) and not(r) and m and d and not(s)) or
(not(x) and not(y) and not(r) and m and not(d) and not(s)) or
(not(x) and y and not(m) and not(d) and not(s)) or
(not(x) and y and not(r) and not(m) and s and not(t)) or
(not(x) and y and not(r) and d and not(s) and not(t)) or
(not(x) and y and not(r) and m and s and not(t)) or
(not(x) and y and not(r) and m and not(d) and not(s) and not(t)) or
(x and y and r and not(m) and not(d) and not(s)) or
(x and y and r and not(m) and d and not(s)) or
(x and y and r and not(m) and s and not(t)) or
(x and y and r and m and d and not(s) and not(t)) or
(x and y and r and m and s and not(t)) or
(x and y and r and m and not(d) and not(s) and not(t));

R'=(not(y) and not(r) and m and d and not(s)) or (not(y) and not(r) and m and not(d) and not(s)) or
(not(x) and not(y) and r and not(d) and not(s) and not(t) and not(w)) or
(not(x) and not(y) and r and not(m) and not(d) and t and not(w)) or
(not(x) and not(y) and r and not(m) and s and not(t) and not(w)) or
(not(x) and not(y) and r and not(m) and d and t and not(w)) or
(not(x) and not(y) and r and d and not(s) and not(t) and not(w)) or
(not(x) and not(y) and r and m and d and t and not(w)) or
(not(x) and not(y) and r and m and s and not(t) and not(w)) or
(not(x) and not(y) and r and m and not(d) and t and not(w)) or
(not(x) and y and r and not(m) and not(d)) or
(not(x) and y and r and not(m) and d and s) or
(not(x) and y and r and m and d and not(s)) or
(not(x) and y and r and m and not(d) and not(s)) or
(not(x) and y and not(r) and not(m) and not(d) and s and t) or
(not(x) and y and not(r) and not(m) and d and s and t) or
(not(x) and y and not(r) and m and d and t) or
(not(x) and y and not(r) and m and not(d) and t) or
(x and y and r and not(m) and not(d)) or
(x and y and r and not(m) and d) or
(x and y and r and m and d and not(s)) or
(x and y and r and m and not(d) and not(s)) or
(x and not(y) and not(r) and not(m) and s) or
(x and y and r and m and s and not(t)) or
(x and y and r and m and not(d) and not(s));

I claim:

1. A method for emulating a wired-OR hardware connection, the method comprising:
    detecting a logic state at a first connector and a logic state at a second connector of a wired-OR logic control device;
    determining that a first node attached to the first connector is driving an active state;
    driving the second connector of the device to an active state in response to determining that the first connector of the logic device is being driven to an active state;
    waiting for the first node to stop driving an active state;
    determining that the first connector is not being driven to an active state;
    stop driving the second connector of the device to the active state in response to determining that the first connector is not being driven to an active state;
    determining that a second node attached to the second connector of the device is driving the second connector to an active state;
    driving the first connector of the device to the active state in response to determining that the second connector is being driven to an active state;
    waiting for the second node to stop driving an active state;
    determining that the second connector is not being driven to an active state; and
    stop driving the first connector to an active state in response to determining that the second connector is not being driven to an active state.

2. The method according to claim 1, wherein the step of determining that a connector is not being driven to an active state comprises detecting that a node is attempting to release the active state and that the node is breaching a preset voltage threshold.

3. The method according to claim 1, wherein detecting is performed by a threshold detection circuit.

4. The method according to claim 1 wherein the logic device comprises a multiplexer for controlling communications with said second node and a plurality of additional nodes.

5. The method according to claim 1 wherein the waiting time is determined by a rising-edge-triggered up-counter.

6. The method of claim 1 wherein the device further comprises a comparator conditioning circuit set to output a '1' when a node attempts to no longer drive an active state.

7. The method of claim 1 further comprising rising-edge-triggered flip-flops to provide inputs to the device from the first and the second connectors.

8. The method of claim 1 wherein the wired-OR device comprises a first driver and a second driver.

9. The method of claim 2 wherein the primary side driver activation speed is increased through the use of both the detection input from the comparator output conditioning circuit and the primary side driver enable.

10. A device for emulating a wired-OR hardware connection, the device comprising:
    a first connector for communicating a first logic state from a first node;
    a second connector for communicating a second logic state from a second node; and
    at least one threshold detector coupled to receive an input from the first connector and an input from the second connector;
    wherein in response to the device determining that the first node is driving an active logic state at the first connector, the device is configured to perform a method, the method comprising:
    driving the second connector of the device to an active state in response to determining that the first connector of the logic device is being driven to an active state;
    waiting for the first node to stop driving an active state;
    determining that the first connector is not being driven to an active state;
    stop driving the second connector of the device to the active state in response to determining that the first connector is not being driven to an active state;
    determining that a second node attached to the second connector of the device is driving the second connector to an active state;
    driving the first connector of the device to the active state in response to determining that the second connector is being driven to an active state;
    waiting for the second node to stop driving an active state;
    determining that the second connector is not being driven to an active state; and
    stop driving the first connector to an active state in response to determining that the second connector is not being driven to an active state.

11. The device of claim 10, wherein the threshold detector comprises a first output terminal for providing a first signal indicative of the input signal having a voltage less than a first threshold voltage.

12. The device of claim 11 further comprising a second output terminal for providing a second signal indicative of the input signal having a voltage less than a second threshold voltage.

* * * * *